United States Patent
Alameh et al.

(10) Patent No.: US 8,294,105 B2
(45) Date of Patent: Oct. 23, 2012

(54) ELECTRONIC DEVICE WITH SENSING ASSEMBLY AND METHOD FOR INTERPRETING OFFSET GESTURES

(75) Inventors: Rachid Alameh, Crystal Lake, IL (US); Thomas Merrell, Beach Park, IL (US); Kenneth A. Paitl, West Dundee, IL (US)

(73) Assignee: Motorola Mobility LLC, Libertyville, IL (US)

( * ) Notice: Subject to any disclaimer, the term of this patent is extended or adjusted under 35 U.S.C. 154(b) by 352 days.

(21) Appl. No.: 12/648,503

(22) Filed: Dec. 29, 2009

(65) Prior Publication Data
US 2010/0295773 A1 Nov. 25, 2010

Related U.S. Application Data

(63) Continuation-in-part of application No. 12/471,062, filed on May 22, 2009.

(51) Int. Cl.
*G01J 5/02* (2006.01)
(52) U.S. Cl. .................................... 250/344
(58) Field of Classification Search .......... 250/330–335, 250/336.1–336.2, 338.1–338.5, 339.01–339.15, 250/340, 341.1–341.8, 344
See application file for complete search history.

(56) References Cited

U.S. PATENT DOCUMENTS

| | | | |
|---|---|---|---|
| 4,286,289 A | 8/1981 | Ottesen et al. | |
| 4,806,709 A | 2/1989 | Evans | |
| 4,914,624 A | 4/1990 | Dunthorn | |
| 4,967,083 A * | 10/1990 | Kornbrekke et al. | 250/341.7 |
| 5,179,369 A | 1/1993 | Person et al. | |
| 5,414,413 A | 5/1995 | Tamaru et al. | |
| 5,684,294 A | 11/1997 | Kouhi | |
| 5,781,662 A | 7/1998 | Mori et al. | |
| 5,821,521 A | 10/1998 | Bridgelall et al. | |
| 5,945,968 A | 8/1999 | Williams et al. | |
| 6,002,427 A | 12/1999 | Kipust | |
| 6,107,994 A | 8/2000 | Harada et al. | |

(Continued)

FOREIGN PATENT DOCUMENTS
EP  1445922 A1  8/2004
(Continued)

OTHER PUBLICATIONS

U.S. Patent and Trademark Office, "Notice of Allowance" for U.S. Appl. No. 12/344,760, Jan. 3, 2011, 9 pages.

(Continued)

*Primary Examiner* — Kiho Kim
(74) *Attorney, Agent, or Firm* — Whyte Hirschboeck Dudek, S.C.; Sylvia Chen

(57) ABSTRACT

A method for controlling an electronic device includes providing a display screen and a sensing assembly including at least one photoreceiver and phototransmitters. Emission of infrared light by the phototransmitters is controlled as an object moves in a first specified pattern of movement and then moves in a second specified pattern of movement, and measured signals are generated. The measured signals are evaluated to identify the first specified pattern, to detect a reference offset location, and to determine, for each of a group of time periods when the object is moving in the second specified pattern, a corresponding location of the object during that period. A centering operation is performed in response to the identification, wherein the centering operation moves an indicator to an initial predetermined reference location on the display screen; and sequential locations of the indicator are controlled in accordance with the corresponding determined locations.

19 Claims, 22 Drawing Sheets

U.S. PATENT DOCUMENTS

| | | |
|---|---|---|
| 6,184,538 B1 | 2/2001 | Bandara et al. |
| 6,215,116 B1 | 4/2001 | Van Marcke |
| 6,246,407 B1 | 6/2001 | Wilks et al. |
| 6,246,862 B1 | 6/2001 | Grivas |
| 6,292,674 B1 | 9/2001 | Davis |
| 6,330,457 B1 | 12/2001 | Yoon |
| 6,438,752 B1 | 8/2002 | McClard |
| 6,460,183 B1 | 10/2002 | Van Der Vleuten |
| 6,525,854 B1 | 2/2003 | Takahashi et al. |
| 6,721,954 B1 | 4/2004 | Nickum |
| 6,804,012 B2 | 10/2004 | Gombert |
| 6,816,154 B2 | 11/2004 | Wong et al. |
| 6,933,922 B2 | 8/2005 | Casebolt et al. |
| 6,941,161 B1 | 9/2005 | Bobisuthi et al. |
| 7,046,230 B2 | 5/2006 | Zadesky et al. |
| 7,134,092 B2 | 11/2006 | Fung et al. |
| 7,166,966 B2 | 1/2007 | Naugler, Jr. et al. |
| 7,212,835 B2 | 5/2007 | Mantyjarvi et al. |
| 7,340,077 B2 | 3/2008 | Gokturk et al. |
| 7,368,703 B2 | 5/2008 | De Samber et al. |
| 7,380,716 B2 | 6/2008 | Yokoyama |
| 7,468,689 B2 | 12/2008 | Ma et al. |
| 7,486,386 B1 | 2/2009 | Holcombe et al. |
| 7,489,297 B2 | 2/2009 | Hohmann et al. |
| 7,519,918 B2 | 4/2009 | Trantow |
| 7,532,196 B2 | 5/2009 | Hinckley |
| 7,534,988 B2 | 5/2009 | Kong et al. |
| 7,557,965 B2 | 7/2009 | Taylor et al. |
| 7,561,146 B1 | 7/2009 | Hotelling |
| 7,630,716 B2 | 12/2009 | Tamura et al. |
| 7,687,774 B2 | 3/2010 | Ohta et al. |
| 7,721,310 B2 | 5/2010 | Schaffer et al. |
| 7,728,958 B2 | 6/2010 | Pfaff |
| 7,795,584 B2 | 9/2010 | Mok et al. |
| 7,855,716 B2 | 12/2010 | McCreary et al. |
| 7,912,376 B2 | 3/2011 | Rollins |
| 7,971,156 B2 | 6/2011 | Albertson et al. |
| 7,991,896 B2 | 8/2011 | Shen et al. |
| 8,006,002 B2 | 8/2011 | Kalayjian et al. |
| 8,018,501 B2 | 9/2011 | Sasaki |
| 8,023,061 B2 | 9/2011 | Ra |
| 8,072,469 B2 | 12/2011 | Ottney |
| 8,104,113 B2 | 1/2012 | Rodenbeck et al. |
| 2001/0019338 A1 | 9/2001 | Roth |
| 2002/0104081 A1 | 8/2002 | Candelore et al. |
| 2002/0122072 A1 | 9/2002 | Selker |
| 2002/0199186 A1 | 12/2002 | Ali et al. |
| 2003/0063128 A1 | 4/2003 | Salmimaa et al. |
| 2003/0222917 A1 | 12/2003 | Trantow |
| 2005/0104860 A1 | 5/2005 | McCreary et al. |
| 2005/0150697 A1 | 7/2005 | Altman et al. |
| 2005/0232447 A1 | 10/2005 | Shinozuka et al. |
| 2005/0289182 A1 | 12/2005 | Pandian et al. |
| 2006/0010400 A1 | 1/2006 | Dehlin et al. |
| 2006/0028453 A1 | 2/2006 | Kawabe |
| 2006/0031786 A1 | 2/2006 | Hillis et al. |
| 2006/0059152 A1 | 3/2006 | Nakamura |
| 2006/0125799 A1 | 6/2006 | Hillis et al. |
| 2006/0132456 A1 | 6/2006 | Anson |
| 2006/0161870 A1 | 7/2006 | Hotelling et al. |
| 2006/0161871 A1 | 7/2006 | Hotelling et al. |
| 2006/0256074 A1 | 11/2006 | Krum et al. |
| 2007/0109266 A1* | 5/2007 | Davis et al. .......... 345/163 |
| 2007/0137462 A1 | 6/2007 | Barros et al. |
| 2007/0177803 A1 | 8/2007 | Elias et al. |
| 2007/0180392 A1 | 8/2007 | Russo |
| 2007/0220437 A1 | 9/2007 | Boillot |
| 2007/0247643 A1 | 10/2007 | Nakamura et al. |
| 2008/0005703 A1 | 1/2008 | Radivojevic et al. |
| 2008/0006762 A1 | 1/2008 | Fadell et al. |
| 2008/0024454 A1 | 1/2008 | Everest |
| 2008/0052643 A1 | 2/2008 | Ike et al. |
| 2008/0079902 A1 | 4/2008 | Mandelstam-Manor et al. |
| 2008/0122803 A1 | 5/2008 | Izadi et al. |
| 2008/0129688 A1 | 6/2008 | Richardson et al. |
| 2008/0161870 A1 | 7/2008 | Gunderson |
| 2008/0165140 A1 | 7/2008 | Christie et al. |
| 2008/0192005 A1 | 8/2008 | Elgoyhen et al. |
| 2008/0195735 A1 | 8/2008 | Hodges et al. |
| 2008/0204427 A1 | 8/2008 | Heesemans et al. |
| 2008/0211771 A1 | 9/2008 | Richardson |
| 2008/0219672 A1 | 9/2008 | Tam et al. |
| 2008/0225041 A1 | 9/2008 | El Dokor et al. |
| 2008/0240568 A1 | 10/2008 | Tonouchi |
| 2008/0252595 A1 | 10/2008 | Boillot |
| 2008/0256494 A1 | 10/2008 | Greenfield |
| 2008/0266083 A1 | 10/2008 | Midholt et al. |
| 2008/0280642 A1 | 11/2008 | Coxhill et al. |
| 2008/0297487 A1 | 12/2008 | Hotelling et al. |
| 2008/0303681 A1 | 12/2008 | Hertz et al. |
| 2008/0309641 A1 | 12/2008 | Harel et al. |
| 2009/0021488 A1 | 1/2009 | Kali et al. |
| 2009/0031258 A1 | 1/2009 | Arrasvuori et al. |
| 2009/0061823 A1 | 3/2009 | Chu |
| 2009/0092284 A1 | 4/2009 | Breed et al. |
| 2009/0158203 A1 | 6/2009 | Kerr et al. |
| 2009/0277697 A1 | 11/2009 | Bolt et al. |
| 2009/0299633 A1 | 12/2009 | Hawes et al. |
| 2009/0303176 A1 | 12/2009 | Chen et al. |
| 2011/0009194 A1 | 1/2011 | Gabai et al. |

FOREIGN PATENT DOCUMENTS

| | | |
|---|---|---|
| EP | 1657819 A2 | 5/2006 |
| EP | 1760573 A2 | 3/2007 |
| EP | 2000896 A2 | 12/2008 |
| EP | 2037349 A2 | 3/2009 |
| JP | 02280427 A | 11/1990 |
| JP | 2005293419 A | 10/2005 |
| JP | 2006010489 A | 1/2006 |
| JP | 2007042020 A | 2/2007 |
| JP | 2009085799 A | 4/2009 |
| KR | 1020030044749 A | 6/2003 |
| KR | 1020050100642 A | 10/2005 |
| WO | 9528777 A1 | 10/1995 |
| WO | 0241129 A2 | 5/2002 |
| WO | 03023701 A2 | 3/2003 |
| WO | 03076870 A1 | 9/2003 |
| WO | 2005076542 A1 | 8/2005 |
| WO | 2005101176 A2 | 10/2005 |
| WO | 2008016394 A2 | 2/2008 |
| WO | 2008073289 A3 | 6/2008 |

OTHER PUBLICATIONS

Patent Cooperation Treaty, "PCT Search Report and Written Opinion of the International Searching Authority" for International Application No. PCT/US2010/030964, Nov. 9, 2010, 24 pages.

Patent Cooperation Treaty, "PCT Search Report and Written Opinion of the International Searching Authority" for International Application No. PCT/US2010/033472, Dec. 15, 2010, 9 pages.

G.Yun and M.Kavehrad, "Spot diffusing and fly-eye receivers for indoor infrared wireless communications", Proc. 1992 IEEE, Conf. Sel, Topics in Wireless Comm., Vancouver, BC, Canada, Jun. 25-26, 1992, pp. 286-292.

Kahn, J.M.; You, R., Djahani, P., Weisbin, A.G."Imaging Diversity Receivers for high-speed infrared wireless communication", IEEE Communications Mag., Dec. 1998, Accessed May 7, 2009; 7 pages.

Ward, A.; Jones A.; Hopper A.; "A new location technique for the active office"; IEEE Personal Communications, 1997; accessed May 7, 2009; 11 pages.

Metzger, C.; Anderson, M.; Starner, T.; "FreeDigiter: A contact-free device for gesture control"; Wearable Computers, 2004; ISWC 2004, 8th International Symposium, vol. 1, 10-31/10-4, 2004, pp. 18-21.

Von Hardenberg, C.; Berard F.; "Bare-hand human-computer interaction" PUI; ACM 1-58113-448-7 Nov. 14, 2001; Orlando, FL, USA; 8 pages.

TrackIR: Vector Expansion: True 6DOF view control offer 3-dimensional virtual reality via motion control; TRACKIR by NaturalPoint; www.naturalpoint.com; 2 pages Aug. 2005.

Bricklin, D.; Gestures, the iPhone, and Standards: A Developer's Questions, www.bricklin.com, 10 pages, 1999-2009.

Gearlog, Microsoft's sidesight: something Apple show watch, www.gearlog.com; 5 pages, 1996-2008, Ziff Davis Publ. Holdings, Inc.

Hadamard transform—Wikipedia definition; http://en.wikipedia.org/wiki/Hadamard_transform; 4 pages, Oct. 2009.

Silicon Laboratories, Inc.; Si1120 Evaluation Kit User's Guide, Austin, TX, Dec. 2009, 10 pages; www.silabs.com/support/pages/contacttechnicalsupport.aspx.

U.S. Appl. No. 12/643,211, filed Dec. 21, 2009; "Electronic device with sensing assembly and method for interpreting consecutive gestures."

U.S. Appl. No. 12/640,867, filed Dec. 17, 2009, "Electronic device with sensing assembly and method for detecting basic gestures."

U.S. Appl. No. 12/646,601, filed Dec. 23, 2009, "Electronic device with sensing assembly and method for detecting gestures of geometric shapes."

U.S. Appl. No. 12/471,062, filed May 22, 2009, "Sensing assembly for mobile device."

U.S. Appl. No. 12/641,830, filed Dec. 18, 2009, "Mobile device with user interaction capability and method of operating same".

U.S. Appl. No. 12/645,244, filed Dec. 22, 2009, "Method and system for conducting communication between mobile devices."

U.S. Appl. No. 12/646,199, filed Dec. 23, 2009, "Method and system for controlling data transmission to or from a mobile device."

U.S. Appl. No. 12/344,760, filed Dec. 29, 2008, "Portable electronic device having self-calibrating proximity sensors."

U.S. Appl. No. 12/347,146, filed Dec. 31, 2008, "Portable electronic device having directional proximity sensors based on device orientation."

Specification of the Bluetooth System; Master Table of Contents & Compliance Requirements; Covered Core Package V. 3.0 +HS; Apr. 21, 2009; 192 pages.

Patent Cooperation Treaty, "PCT Search Report and Written Opinion of the International Searching Authority" for International Application No. PCT/US2009/066555, Jul. 16, 2010, 11 pages.

U.S. Appl. No. 12/428,187, filed Apr. 22, 2009 "Menu Configuration System and Method for Display on an Electronic Device".

U.S. Appl. No. 12/428,266, filed Apr. 22, 2009 "Touch-Screen and Method for an Electronic Device".

U.S. Appl. No. 12/500,625, filed Jul. 10, 2009 "Devices and Methods for Adjusting Proximity Detectors".

United States Patent and Trademark Office, "Non-Final Office Action" for U.S. Appl. No. 12/347,146, Jul. 18, 2011, 9 pages.

United States Patent and Trademark Office, "Non-Final Office Action" for U.S. Appl. No. 12/428,260, Oct. 5, 2011, 10 pages.

Patent Cooperation Treaty, "Notification of Transmittal of the International Search Report and the Written Opinion of the International Searching Authority, or the Declaration" for PCT/US2010/039561, Sep. 30, 2010, pp. 1-13.

Patent Cooperation Treaty, "Notification of Transmittal of the International Search Report and the Written Opinion of the International Searching Authority, or the Declaration" for PCT/US2010/028654, Dec. 1, 2010, pp. 1-22.

Patent Cooperation Treaty, "PCT Search Report and Written Opinion of the International Searching Authority" for International Application No. PCT/US2010/061254, Apr. 7, 2011, 16 pages.

Patent Cooperation Treaty, "PCT Search Report and Written Opinion of the International Searching Authority" for International Application No. PCT/US2010/061261, Mar. 17, 2011, 14 pages.

United States Patent and Trademark Office, "Non-Final Rejection" for U.S. Appl. No. 12/471,062, Apr. 25, 2011, 16 pages.

Vladislav Pavlov et al., "Model-based object characterization with active infrared sensor array," IEEE Sensors Conference, 2007, pp. 360-363.

Henrik V. Christensen, "Retrieval of 3D-position of a Passive Object using Infrared LED's and Photodiodes," International Conference on Acoustics, Speech, and Signal Processing (ICASSP), 2005, pp. IV1093-96.

United States Patent and Trademark Office, "Non-Final Rejection" for U.S. Appl. No. 12/471,062, Oct. 4, 2011, 17 pages.

United States Patent and Trademark Office, "Non-Final Rejection" for U.S. Appl. No. 12/428,187, Oct. 26, 2011, 27 pages.

United States Patent and Trademark Office, "Non-Final Rejection" for U.S. Appl. No. 12/640,867, Sep. 30, 2011, 11 pages.

United States Patent and Trademark Office, "Non-Final Rejection" for U.S. Appl. No. 12/500,625, Dec. 29, 2011, 30 pages.

United States Patent and Trademark Office, "Final Rejection" for U.S. Appl. No. 12/428,187, Apr. 10, 2012, 10 pages.

United States Patent and Trademark Office, "Final Rejection" for U.S. Appl. No. 12/428,266, Mar. 14, 2012, 9 pages.

United States Patent and Trademark Office, "Final Rejection" for U.S. Appl. No. 12/471,062, Feb. 22, 2012, 15 pages.

Jungsoo Kim et al., "The Gesture Watch: A Wireless Contact-free Gesture based Wrist Interface", 11th IEEE Int'l Symp. on Wearable Computers, 2007, pp. 15-22.

United States Patent and Trademark Office, "Non-Final Rejection" for U.S. Appl. No. 12/646,601, Feb. 14, 2012, 9 pages.

Thad Starner et al., "The Gesture Pendant: A Self-illuminating, Wearable, Infared Computer Vision System for Home Automation Control and Medical Monitoring", 4th IEEE Int'l Symp. on Wearable Computers, 2000, pp. 87-94.

Heinrich Ruser, "Object recognition with a smart low-cost active infared sensor array", 1st Int'l Conf. on Sensing Tech., Nov. 21-23, 2005, pp. 494-499.

United States Patent and Trademark Office, "Final Rejection" for U.S. Appl. No. 12/640,867, Mar. 30, 2012, 11 pages.

United States Patent and Trademark Office, "Non-Final Rejection" for U.S. Appl. No. 12/646,199, Mar. 7, 2012, 17 pages.

United States Patent and Trademark Office, "Notice of Allowance" for U.S. Appl. No. 13/283,984, Dec. 21, 2011, 9 pages.

* cited by examiner

ELECTRONIC DEVICE WITH SENSING ASSEMBLY AND METHOD FOR INTERPRETING OFFSET GESTURES

CROSS-REFERENCE TO RELATED APPLICATIONS

This application is a continuation-in-part of and claims the benefit of U.S. patent application Ser. No. 12/471,062, titled "Sensing Assembly For Mobile Device" and filed on May 22, 2009, which is hereby incorporated by reference herein.

STATEMENT REGARDING FEDERALLY SPONSORED RESEARCH OR DEVELOPMENT

--

FIELD OF THE INVENTION

The present invention relates generally to electronic devices and, more particularly, to an electronic device having an infrared sensing assembly for detecting and interpreting gestures which are performed by an object that is offset from the sensing assembly and/or a display screen of the electronic device.

BACKGROUND OF THE INVENTION

Mobile devices such as cellular telephones, smart phones, and other handheld or portable electronic devices such as personal digital assistants (PDAs), headsets, MP3 players, etc. have become popular and ubiquitous. As more and more features have been added to mobile devices, there has been an increasing desire to equip these mobile devices with input/output mechanisms that accommodate numerous user commands and/or react to numerous user behaviors. For example, many mobile devices are now equipped not only with buttons or keys/keypads, but also with capacitive touch screens by which a user, simply by touching the surface of the mobile device and/or moving the user's finger along the surface of the mobile device, is able to communicate to the mobile device a variety of messages or instructions.

It is of increasing interest that mobile devices be capable of detecting the presence of, and determining with some accuracy the position of, physical objects located outside of the mobile devices and, more particularly, the presence and location of human beings (or portions of their bodies, such as their heads or hands) who are using the mobile devices or otherwise are located nearby the mobile devices. By virtue of such capabilities, the mobile devices are able to adjust their behavior in a variety of manners that are appropriate given the presence (or absence) and location of the human beings and/or other physical objects.

Although prior art devices such as capacitive touch screens are useful as input/output devices for phones, such touch screens are fairly complicated electronic devices that are expensive and require a large number of sensing devices that are distributed in location across a large surface area of the phone. Also, such touch screens are limited insofar as they only allow a user to provide input signals if the user is actually physically touching the touch screens. Further, while remote sensing devices such as infrared (or, more accurately, near-infrared) transceivers have been employed in the past in some mobile devices to allow for the detection of the presence and/or location of human beings and/or physical objects even when not in physical contact with the mobile devices, such sensing devices have been limited in various respects.

In particular, some such near-infrared transceivers in some such mobile devices are only able to detect the presence or absence of a human being/physical object within a certain distance from the given transceiver (e.g., binarily detect that the human being/physical object is within a predetermined distance or proximity to the transceiver), but not able to detect the three-dimensional location of the human being/physical object in three-dimensional space relative to the transceiver. Also, some such transceivers in some such mobile devices are undesirably complicated or require large numbers of components in order to operate, which in turn renders such devices unduly expensive.

Therefore, for the above reasons, it would be advantageous if a new sensing device or sensing devices suitable for one or more types of electronic devices could be developed that overcame one or more of the above-described limitations, and/or one or more other limitations.

DETAILED DESCRIPTION

Figure 1:
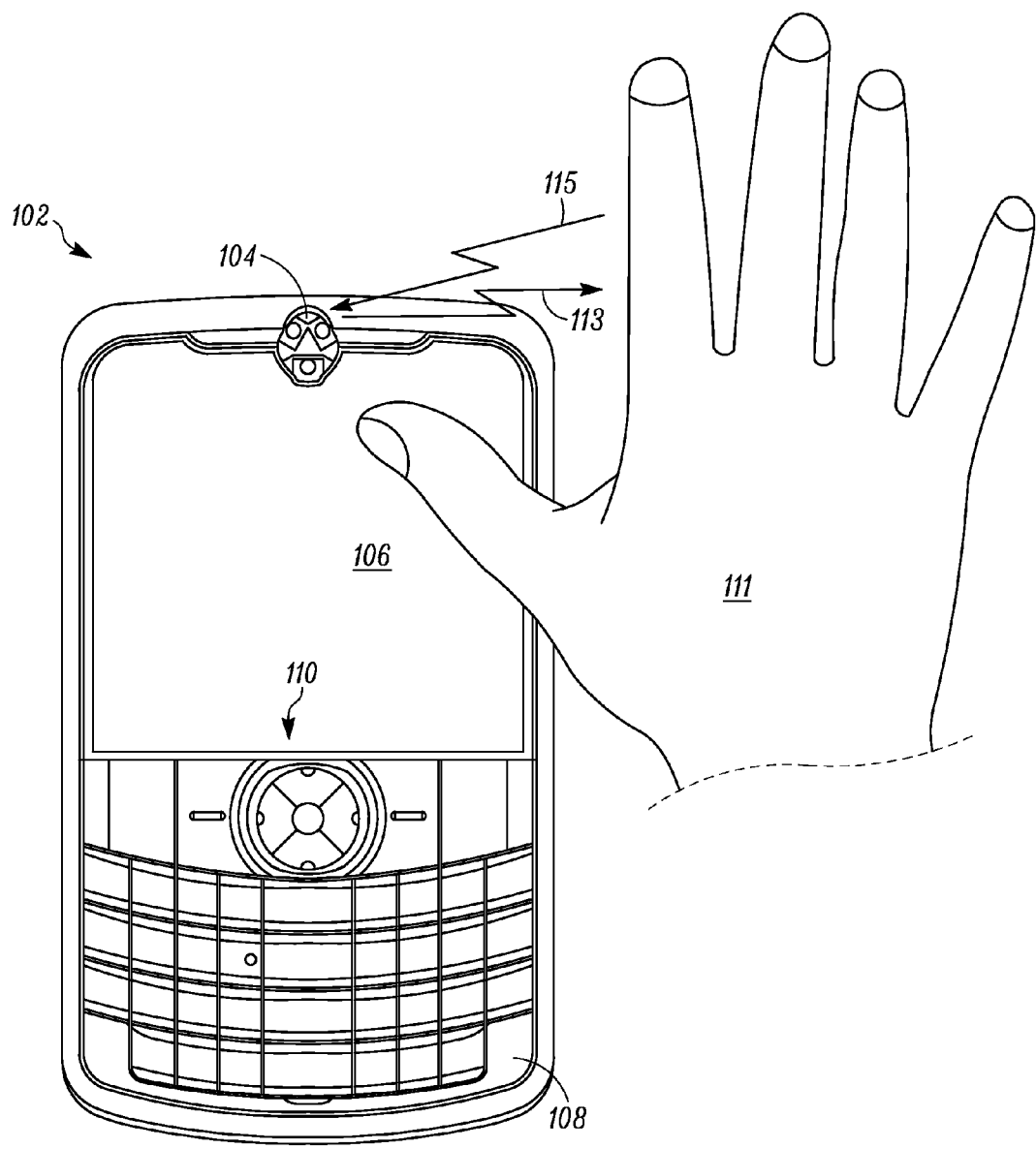
FIG. 1 is a front elevation view of an exemplary electronic device that employs an exemplary pyramid-type sensing assembly capable of allowing sensing of the location of an exemplary external object (shown partially in cut-away), in accordance with one embodiment of the present invention.

An infrared sensing assembly enables detection of one or more gestures, where the gestures are predetermined patterns of movement of an external object relative to an electronic device that also includes a processor in communication with the sensing assembly. These gestures can be defined to be performed in a three dimensional space and can include for example, a push/pull gesture (movement of the object toward or away from the electronic device along a z axis), a slide gesture (movement of the object in an xy plane across the electronic device), a hover gesture (stationary placement of the object for a predetermined amount of time), and a tilt gesture (rotation of the object about a roll, pitch, or yaw axis). Detection of these gestures can be used to control the electronic device in a variety of ways. The infrared sensing assembly can be configured in various forms and includes one or more phototransmitters which are controlled to emit infrared light outward away from the electronic device to be reflected by the external object, and one or more photoreceivers for receiving light which was emitted from the phototransmitter(s) and was reflected from the external object.

For example, the sensing assembly can include at least one photoreceiver and multiple phototransmitters, wherein each phototransmitter is positioned to emit infrared light away from the electronic device about a corresponding central transmission axis, wherein each central transmission axis is oriented in a different direction with respect to the others. The processor controls the phototransmitters such that each emits infrared light at a respective portion of each of a plurality of sequential time periods (or at the same time during each time period as further described below) as the external object moves in the specified pattern of movement. For each of the phototransmitters and for each of the sequential time periods, a corresponding measured signal is generated which is indicative of a respective amount of infrared light which originated from that phototransmitter during that time period and was reflected by the external object prior to being received by the photoreceiver. The measured signals can be divided into measured signal sets, with each set corresponding to a respective one of the phototransmitters and including intensity values over time (over multiple time periods). These sets can be analyzed to determine corresponding locations of the external object at multiple points in time and to detect predetermined patterns of movement, because each measured signal set is able to provide information regarding whether the object is in a corresponding portion of a three dimensional space reachable by the infrared light. The electronic device can then be controlled based on the identified locations or patterns of movement.

As another example, the sensing assembly can include a single phototransmitter and multiple photoreceivers, wherein the photoreceivers are arranged so as to receive infrared light about a corresponding central receiving axis, wherein each central receiving axis is oriented in a different direction with respect to the others. In this case, the phototransmitter is controlled to emit light during each of a plurality of sequential time periods, and for each of the photoreceivers and for each of the time periods, a corresponding measured signal is generated which is indicative of a respective amount of infrared light which originated from the phototransmitter during that time period and was reflected by the external object prior to being received by that photoreceiver. Again, the measured signals can be divided into measured signal sets, with each set in this case corresponding to a respective one of the photoreceivers and including intensity values over time (over multiple time periods). These sets can be analyzed to determine corresponding locations of the external object at multiple points in time to detect predetermined patterns of movement, and to control the electronic device accordingly.

It can be desirable for certain gestures to be performed in an offset manner with respect to a generally centered location above a sensing assembly, especially in the case where the sensing assembly is in close proximity to a display screen and the gestures are used to control an indicator (such as a cursor or other item) on the display screen. For example, it can be advantageous for gestures for controlling the location and/or orientation of the indicator on a display screen to be performed off to the side with respect to the sensing assembly and the display screen to allow the display screen to remain unobstructed during performance of the gestures. An offset gesture interpretation routine can operate to detect offset gestures, and can be triggered by a first specified pattern of movement of an object.

Referring to FIG. 1, an exemplary electronic device 102 is shown that includes, among its various components, an exemplary sensing assembly 104. As shown, the electronic device 102 is a mobile device such as personal digital assistant (PDA), albeit the electronic device is also intended to be representative of a variety of other devices that are encompassed within the scope of the present invention including, for example, cellular telephones, smart phones, other handheld or portable electronic devices such as notebook or laptop computing devices, headsets, MP3 players and other portable video and audio players, navigation devices (e.g., such as those sold by Garmin International, Inc. of Olathe, Kans.), touch screen input devices, pen-based input devices, other mobile devices and even other devices, including a wide variety of devices that can utilize or benefit from directional control or control based upon the sensed presence and location of one or more external objects (e.g., televisions, kiosks, ATMs, vending machines, automobiles, etc.). Further included among the components of the electronic device 102 as shown in FIG. 1 are a video screen 106, a keypad 108 having numerous keys, and a navigation key cluster (in this case, a "five-way navigation area") 110.

As will be described in further detail with respect to FIG. 3, the sensing assembly 104 in the present embodiment is a first embodiment of a pyramid-type sensing assembly that is capable of being used to detect the presence of an object (or a collection of objects) external to the electronic device 102 (and external to the sensing assembly itself). Depending upon the circumstance, the physical object (or objects) that is sensed can include a variety of inanimate objects and/or, in at least some circumstances, one or more portions of the body of a human being who is using the electronic device (or otherwise is in proximity to the electronic device) such as the human being's head or, as shown (partly in cutaway), a hand 111 of the human being. In the present embodiment, the sensing assembly 104 not only detects the presence of such an object in terms of whether such object is sufficiently proximate to the sensing assembly (and/or the electronic device), but also detects the object's three-dimensional location relative to the electronic device 102 in three-dimensional space, and at various points over time.

In the present embodiment, the sensing assembly 104 operates by transmitting one or more (typically multiple) infrared signals 113 out of the sensing assembly, the infrared signals 113 being generated by one or more infrared phototransmitters (e.g., photo-light emitting diodes (photo-LEDs)). More particularly, the phototransmitters can, but need not, be near-infrared photo-LEDs transmitting light having wavelength(s) in the range of approximately 850 to 890 nanometers. Portions of the infrared signal(s) 113 are then reflected by an object (or more that one object) that is present such as the hand 111, so as to constitute one or more reflected signals 115. The reflected signals 115 are in turn sensed by one or more infrared light sensing devices or photoreceivers (e.g., photodiodes), which more particularly can (but need not) be suited for receiving near-infrared light having wavelength(s) in the aforementioned range. As will be described in further detail below, by virtue of employing either multiple phototransmitters or multiple photoreceivers, the three-dimensional position of the hand 111 relative to the sensing assembly (and thus relative to the electronic device) can be accurately determined.

Figure 2:
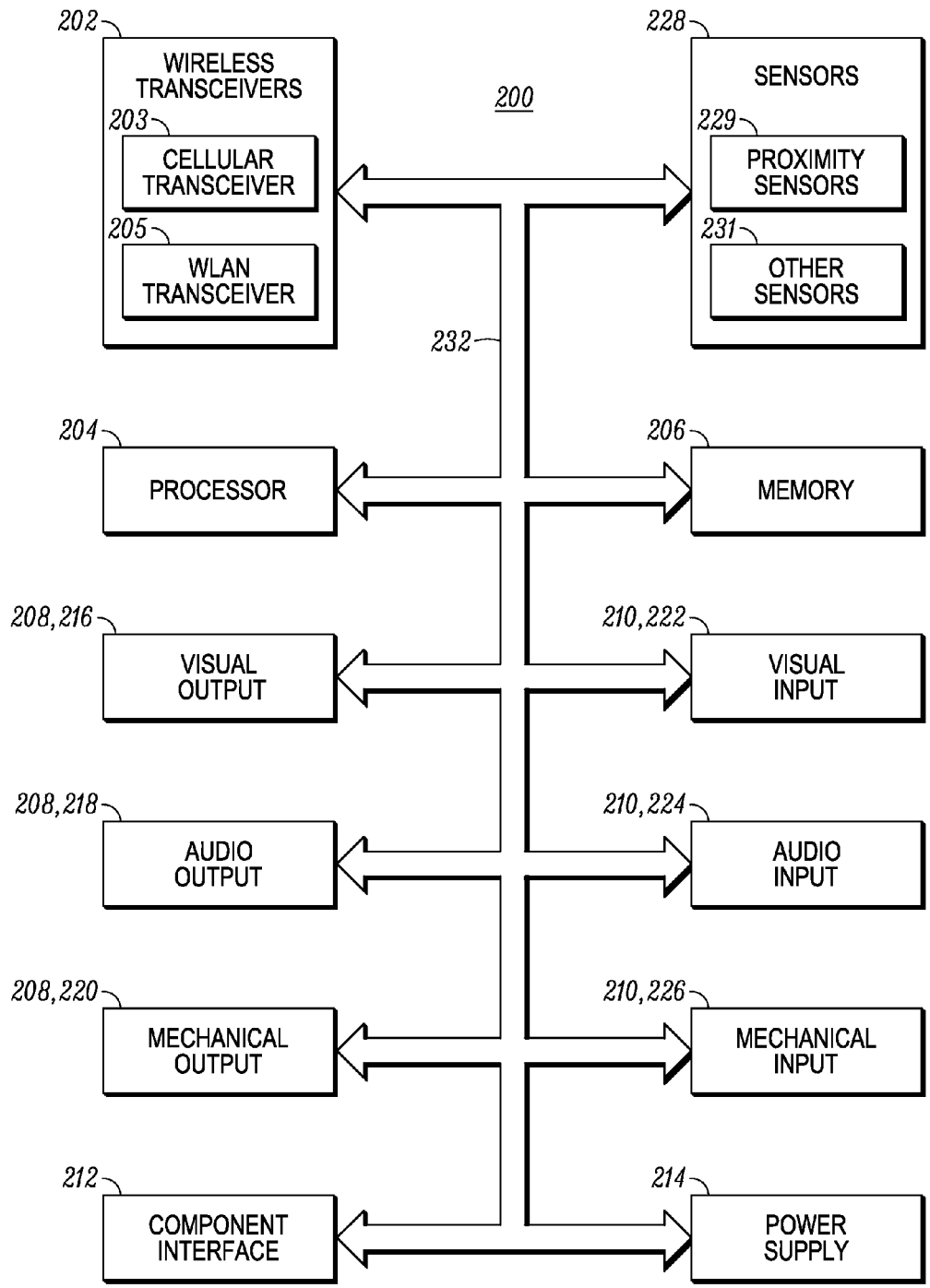
FIG. 2 is a block diagram illustrating exemplary components of the electronic device of FIG. 1.

Referring to FIG. 2, a block diagram illustrates exemplary internal components 200 of a mobile device implementation of the electronic device 102, in accordance with the present invention. The exemplary embodiment includes wireless transceivers 202, a processor 204 (e.g., a microprocessor, microcomputer, application-specific integrated circuit, etc.), a memory portion 206, one or more output devices 208, and one or more input devices 210. In at least some embodiments, a user interface is present that comprises one or more output devices 208 and one or more input devices 210. The internal components 200 can further include a component interface 212 to provide a direct connection to auxiliary components or accessories for additional or enhanced functionality. The internal components 200 preferably also include a power supply 214, such as a battery, for providing power to the other internal components. As will be described in further detail, the internal components 200 in the present embodiment further include sensors 228 such as the sensing assembly 104 of FIG. 1. All of the internal components 200 can be coupled to one another, and in communication with one another, by way of one or more internal communication links 232 (e.g., an internal bus).

Each of the wireless transceivers 202 utilizes a wireless technology for communication, such as, but not limited to, cellular-based communication technologies such as analog communications (using AMPS), digital communications (using CDMA, TDMA, GSM, iDEN, GPRS, EDGE, etc.), and next generation communications (using UMTS, WCDMA, LTE, IEEE 802.16, etc.) or variants thereof, or peer-to-peer or ad hoc communication technologies such as HomeRF, Bluetooth and IEEE 802.11 (a, b, g or n), or other wireless communication technologies such as infrared technology. In the present embodiment, the wireless transceivers 202 include both cellular transceivers 203 and a wireless local area network (WLAN) transceiver 205, although in other embodiments only one of these types of wireless transceivers (and possibly neither of these types of wireless transceivers, and/or other types of wireless transceivers) is present. Also, the number of wireless transceivers can vary from zero to any positive number and, in some embodiments, only one wireless transceiver is present and further, depending upon the embodiment, each wireless transceiver 202 can include both a receiver and a transmitter, or only one or the other of those devices.

Exemplary operation of the wireless transceivers 202 in conjunction with others of the internal components 200 of the electronic device 102 can take a variety of forms and can include, for example, operation in which, upon reception of wireless signals, the internal components detect communication signals and the transceiver 202 demodulates the communication signals to recover incoming information, such as voice and/or data, transmitted by the wireless signals. After receiving the incoming information from the transceiver 202, the processor 204 formats the incoming information for the one or more output devices 208. Likewise, for transmission of wireless signals, the processor 204 formats outgoing information, which may or may not be activated by the input devices 210, and conveys the outgoing information to one or more of the wireless transceivers 202 for modulation to communication signals. The wireless transceiver(s) 202 convey the modulated signals to a remote device, such as a cell tower or a remote server (not shown).

Depending upon the embodiment, the input and output devices 208, 210 of the internal components 200 can include a variety of visual, audio, and/or mechanical outputs. For example, the output device(s) 208 can include a visual output device 216 such as a liquid crystal display and light emitting diode indicator, an audio output device 218 such as a speaker, alarm, and/or buzzer, and/or a mechanical output device 220 such as a vibrating mechanism. The visual output devices 216 among other things can include the video screen 106 of FIG. 1. Likewise, by example, the input devices 210 can include a visual input device 222 such as an optical sensor (for example, a camera), an audio input device 224 such as a microphone, and a mechanical input device 226 such as a Hall effect sensor, accelerometer, keyboard, keypad, selection button, touch pad, touch screen, capacitive sensor, motion sensor, and/or switch. The mechanical input device 226 can in particular include, among other things, the keypad 108 and the navigation key cluster 110 of FIG. 1. Actions that can actuate one or more input devices 210 can include, but need not be limited to, opening the electronic device, unlocking the device, moving the device, and operating the device.

Although the sensors 228 of the internal components 200 can in at least some circumstances be considered as being encompassed within input devices 210, given the particular significance of one or more of these sensors 228 to the present embodiment the sensors instead are described independently of the input devices 210. In particular as shown, the sensors 228 can include both proximity sensors 229 and other sensors 231. As will be described in further detail, the proximity sensors 229 can include, among other things, one or more sensors such as the sensing assembly 104 of FIG. 1 by which the electronic device 102 is able to detect the presence of (e.g., the fact that the electronic device is in sufficient proximity to) and location of one or more external objects including portions of the body of a human being such as the hand 111 of FIG. 1. By comparison, the other sensors 231 can include other types of sensors, such as an accelerometer, a gyroscope, or any other sensor that can help identify a current location or orientation of the electronic device 102.

The memory portion 206 of the internal components 200 can encompass one or more memory devices of any of a variety of forms (e.g., read-only memory, random access memory, static random access memory, dynamic random access memory, etc.), and can be used by the processor 204 to store and retrieve data. The data that is stored by the memory portion 206 can include, but need not be limited to, operating systems, applications, and informational data. Each operating system includes executable code that controls basic functions of the communication device, such as interaction among the various internal components 200, communication with external devices via the wireless transceivers 202 and/or the component interface 212, and storage and retrieval of applications and data to and from the memory portion 206. Each application includes executable code that utilizes an operating system to provide more specific functionality for the communication devices, such as file system service and handling of protected and unprotected data stored in the memory portion 206. Informational data is non-executable code or information that can be referenced and/or manipulated by an operating system or application for performing functions of the communication device.

Figure 3:
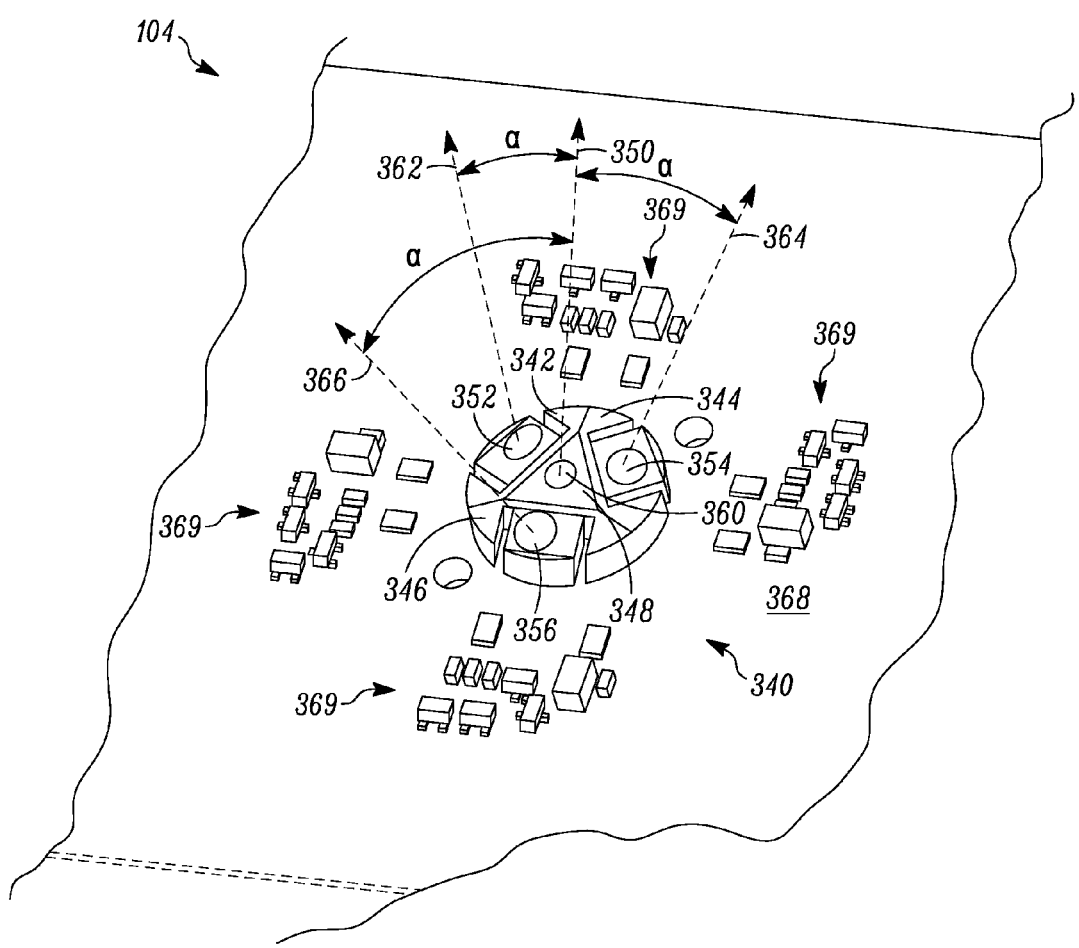
FIG. 3 is a front perspective view showing in more detail components of the pyramid-type sensing assembly of FIG. 1.

Turning to FIG. 3, components of the sensing assembly 104 of FIG. 1 are shown in more detail. As shown, the sensing assembly 104 in particular includes a pyramid-type housing structure 340 that more particularly can be considered a tetrahedral structure that is circular in cross-section and has first, second, and third inclined surfaces 342, 344, and 346, respectively, that extend downward from a triangular top surface 348. Embedded within the inclined surfaces 342, 344, and 346 are first, second and third phototransmitters 352, 354, and 356, respectively, which as noted above can be photo-LEDs suitable for emitting infrared light. The first, second and third phototransmitters 352, 354, and 356 are particularly oriented in a manner corresponding to their respective inclined surfaces 342, 344, and 346. That is, each of first, second, and third center axes of transmission 362, 364, and 366 extending from the respective phototransmitters is perpendicular/normal to a respective one of the inclined surfaces 342, 344, and 346. Further, each of the center axes of transmission 362, 364, and 366 is generally offset by an angle α from a perpendicular axis 350 extending perpendicularly/normally from the top surface 348. The perpendicular axis 350 in the present embodiment is also perpendicular to the surface of the video screen 106 and generally to the overall front surface of the electronic device 102 upon which the sensing assembly 104, video screen 106, keypad 108, and navigation key cluster 110 are all mounted.

Further as shown in FIG. 3, the pyramid-type sensing assembly 104 also includes an additional photoelectric device in addition to the phototransmitters 352, 354 and 356 (which themselves are photoelectric devices), namely, a photoreceiver 360 that is mounted along the top surface 348 and, in the present embodiment, is particularly arranged within the center of that surface (e.g., arranged at the center of the isosceles triangular surface). The photoreceiver 360, which as noted above can be a photodiode or phototransistor suitable for receiving infrared light, more particularly is arranged so that its center axis of reception is aligned with the perpendicular axis 350. Therefore, while the phototransmitters 352, 354, and 356 are oriented so as to emit light generally about the three center axes of transmission 362, 364, and 366, the photoreceiver 360 is orientated so as to receive light generally about the perpendicular axis 350. In short, the pyramid-type sensing assembly 104 can thus be described as including a single photoreceiver that is surrounded on its sides by three phototransmitters that are equally-spaced apart from one another as one proceeds around the photoreceiver, and that are offset in terms of their vertical rotational orientations from the vertical rotational orientation of the photoreceiver by the same angular amount, where all of these components are housed within a tetrahedrally-shaped housing with surfaces that correspond to the rotational orientations of the phototransmitters and photoreceiver. In other cases, both multiple phototransmitters and multiple photoreceivers can be used, for example, with the phototransmitters orientated as described above, and such that one or more of the photoreceivers are oriented to better receive reflected light that emitted from a respective phototransmitter.

Due to the particular orientations of the phototransmitters 352, 354, 356 and the photoreceiver 360, light from the respective phototransmitters is directed generally in three different directions corresponding to the center axes of transmission 362, 364, 366 (although there may be some overlapping of the ranges within which the respective phototransmitters direct light), while the photoreceiver 360 due to its central location and orientation along the perpendicular axis 350 is potentially capable of receiving reflected light from a variety of directions that can overlap the directions of transmission of each of the three of the phototransmitters. More particularly, because the photoreceiver 360 is capable of receiving light from a wider range of angles about the perpendicular axis 350 than the ranges of angles about the respective center axes of transmission 362, 364, 366 within which the respective phototransmitters are capable of directing light, in the present embodiment the overall sensing assembly 104 operates predicated upon the assumption that the photoreceiver is capable of receiving light that is reflected off of an object such as the hand 111 even though the reflected light may have originated from any one or more of the three phototransmitters.

Further as illustrated in FIG. 3, the components of the sensing assembly 104 described above can be mounted directly upon a circuit board 368 upon which other components such as components 369 are mounted. By virtue of this direct mounting of the sensing assembly 104, the sensing assembly 104 need not protrude out far from the overall surface of the electronic device 102 on which the video screen 106, keypad 108 and navigation key cluster 110 are all situated. In the embodiment of FIG. 3, the sensing assembly 104 is particularly shown to be implemented near a top edge of the front surface of the electronic device 102, which often is the location of a speaker of a mobile phone. However, as discussed further below, other positions for such a sensing assembly are also possible.

Figure 4:
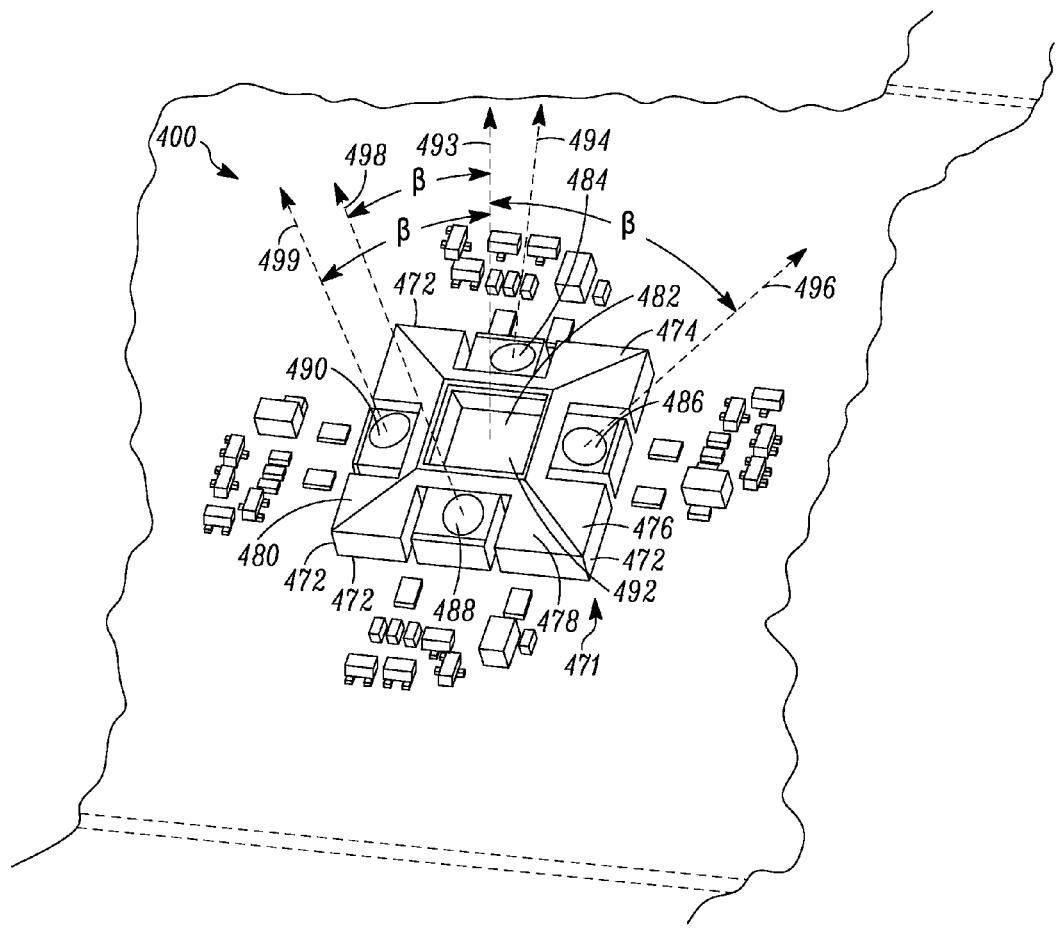
FIG. 4 is a front perspective view showing components of an alternate embodiment of pyramid-type sensing assembly differing from that of FIGS. 1 and 3, in accordance with another embodiment of the present invention.

Turning next to FIG. 4, the present invention is intended to encompass numerous other pyramid-type sensing assemblies other than that shown in FIG. 3. For example, as shown in FIG. 4, a sensing assembly 400 is employed that has a more conventional four-sided pyramid-type shape (by comparison with the tetrahedral shape of FIG. 3). More particularly, the sensing assembly 400 has a pyramid-type housing structure 471 having four edges forming a square perimeter 472, and four inclined surfaces 474, 476, 478, and 480. Similar to the sensing assembly 104 of FIG. 3, the housing structure 471 of the sensing assembly 400 additionally includes a top surface 482 from which each of the respective four inclined surfaces 474, 476, 478, and 480 slope downwardly. With respect to the sensing assembly 104, phototransmitters 484, 486, 488, and 490, such as photo-LEDs, are each situated along a respective one of the inclined surfaces 474, 476, 478, and 480, and a photoreceiver 492, such as a photodiode, is mounted on the top surface 482. Thus, similar to the sensing assembly 104, the sensing assembly 400 includes multiple phototransmitters arranged about (and equally spaced about) a single photoreceiver that is centrally positioned in between the phototransmitters.

Further as shown in FIG. 4, a center axis of reception of the photoreceiver 492 again is aligned with a perpendicular axis 493 normally extending from the top surface 482, which is angularly spaced apart by an angle β from each first, second, third, and fourth center axes of transmission 494, 496, 498, and 499 of the respective phototransmitters 484, 486, 488, and 490. In other embodiments, one or more of the phototransmitters can be arranged so as to have an associated angle different than the others. Thus, as with the sensing assembly 104, the respective phototransmitters 484, 486, 488, 490 each are vertically rotationally offset relative to the perpendicular axis 493 (and thus relative to the center axis of reception of the photoreceiver 492) in a manner corresponding to the slopes of the respective inclined surfaces 474, 476, 478, 480 with which the phototransmitters are associated. Also as with the sensing assembly 104, the photoreceiver 492 is capable of receiving light within a much wider range of angles relative to the perpendicular axis 493 than the respective phototransmitters 484, 486, 488, 490 transmit light relative to their respective center axes of transmission 494, 496, 498, 499, and operation of the sensing assembly 400 again is predicated upon the assumption that the photoreceiver 492 is capable of receiving light that is reflected off of an external object that may have been transmitted by any one or more of the phototransmitters 484, 486, 488, 490.

Figure 5:
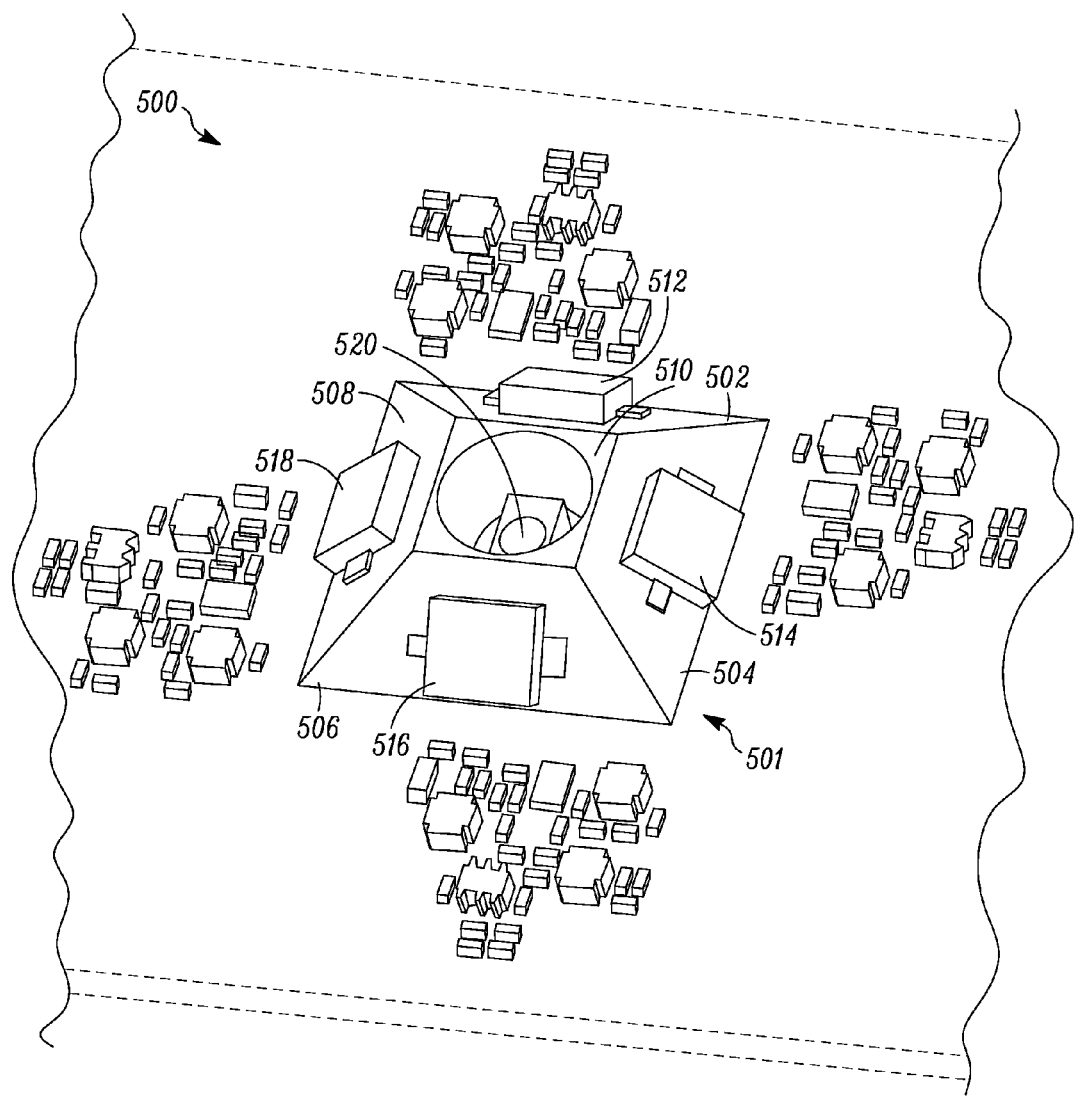
FIG. 5 is a front perspective view showing components of an additional alternate embodiment of pyramid-type sensing assembly differing from those of FIGS. 1, 3 and 4, in accordance with still another embodiment of the present invention.

Referring next to FIG. 5, a further alternate embodiment of a sensing assembly 500 is shown. In this embodiment, the sensing assembly 500 again has a pyramid-type housing structure 501 with four inclined surfaces 502, 504, 506 and 508, respectively, each of which is inclined and slopes downwardly from a horizontal top surface 510. In this embodiment, however, the sensing assembly 500 does not employ phototransmitters on the inclined surfaces 502, 504, 506 and 508, but rather has mounted on those surfaces first, second, third and fourth photoreceivers 512, 514, 516, and 518, respectively. Further, instead of employing a photoreceiver along the top surface 510, instead a phototransmitter 520 is mounted along (or, more particularly, recessed within) that surface. Given this design, in contrast to the embodiments of FIGS. 3 and 4, it is expected that light emitted from the phototransmitter 520, upon being reflected by an object or objects external to the electronic device (e.g., the hand 111), will be reflected to one or more of the photoreceivers 512, 514, 516 and 518.

Although not shown in FIGS. 3-5, in some circumstances the photoreceivers 360, 492 and 512, 514, 516, 518 need not extend up to the very outer surfaces of the sensing assemblies/pyramid-type housing structures, but rather above those photoreceivers additional structures can be positioned, such as transparent windows or walls that provide protection for the photoreceivers and/or provide additional desired optical properties. In some such circumstances, for example, such transparent windows can constitute waveguides (or "V-notches" or Compound Parabolic Concentrator (CPC) waveguides) that serve to better direct incoming reflected light into the photoreceivers, and/or that serve as lenses for magnification purposes, improving gain and/or minimizing local coupling. In some cases, certain portions of the surfaces surrounding the photoreceivers can be coated with silver or copper paint (or other shiny material) so as to reflect infrared light toward the photoreceivers. Also, in some cases, the photoreceivers themselves can be shielded (e.g.; electrically shielded) or can be "black diodes" to alleviate background lighting issues, internal reflection/noise and/or noise from the phototransmitters of the sensing assembly. These types of features can be of particular interest in relation to the embodiments such as those of FIGS. 3-4 involving a single photoreceiver.

Further, depending upon the embodiment, the photoreceivers can take a variety of forms including, for example, angle-diversity receivers or fly-eye receivers. Depending upon the embodiment, various filters can be employed above the photoreceivers and/or phototransmitters to filter out undesired light. Different filters can in some circumstances be employed with different ones of the phototransmitters/photoreceivers, for example, to allow for different colors of light to be associated with, transmitted by, or received by, the different components.

Each of the embodiments of sensing assemblies shown in FIGS. 3, 4 and 5 are similar (notwithstanding their differences) in that multiple phototransmitters and/or photoreceivers are co-located (that is, commonly located) in a single or shared small region, that is, a region that is small by comparison with the overall surface dimensions of the electronic device on which the sensing assemblies are intended to be implemented. Further, in at least these embodiments, it is additionally the case that either only one photoreceiver (where multiple phototransmitters are present) or only one phototransmitter (where multiple photoreceivers are present) is used, although the present invention is also intended to encompass other embodiments in which there are multiple phototransmitters as well as multiple photoreceivers that are co-located. Also, as already mentioned with respect to FIG. 3, in each of these embodiments, the phototransmitter(s)/photoreceiver(s) and associated pyramid-type housing structures can be (but need not be) mounted on a circuit board along with other circuit components.

The co-location of the phototransmitter(s)/photoreceiver(s) mounted in the pyramid-type housing structures in accordance with embodiments such as those of FIGS. 3-5 is beneficial in several regards. First, by virtue of the co-location of photoreceiving and phototransmitting devices in the manners shown, including the particular orientations shown (e.g., relative to the perpendicular axes 350, 493), it is possible for the respective sensing assembly to allow for the sensing not only of the presence of an external object (that is, to detect the fact that the object is within a given distance or proximity relative to the sensing assembly) but also the location of an external object such as the hand 111 in three-dimensional space relative to the sensing assembly. Indeed, this can be accomplished even though, in each of the embodiments of FIGS. 3-5, there is only one of either a phototransmitter or a photoreceiver, as discussed in further detail with reference to FIG. 6 below. Further, by virtue of the co-location of the photoreceiving and phototransmitting devices in the manners shown, in the pyramid-type housing structures, the resulting sensing assemblies are both robust and concentrated (rather than distributed) in design. Thus, the sensing assemblies can potentially be discrete structures that can be implemented in relation to many different types of existing electronic devices, by way of a relatively simple installation process, as add-on or even aftermarket devices.

It should be noted that the particular angular ranges associated with the transmission or reception of light by the different phototransmitters and photoreceivers associated with sensing assemblies such as those described above can vary with the embodiment and depending upon the intended purpose. As noted earlier, typically photoreceivers can have a range of reception (e.g., very broad such as a 60 degree range to narrow based on an associated integrated lensing scheme)

that is larger than the range of transmission of the phototransmitters (e.g., a 20 degree range). Nevertheless, this need not be the case in all embodiments. That said, it should further be noted that it is anticipated that, in practical implementations, the embodiments of FIGS. 3 and 4 may be superior to that of FIG. 5 insofar as it is commonly the case that the angular range over which a given photoreceiver is capable of receiving light is considerably larger than the angular range over which a phototransmitter is capable of sending light and as such more severe tilting of the photoreceivers in the embodiment of FIG. 5 would be need to distinguish between reflected light signals. Also, the use of a single photoreceiver to receive the reflected light originating from multiple phototransmitters as is the case with the embodiments of FIGS. 3-4 typically allows for simpler sensing circuitry to be used because receiver circuitry is usually more complex than transmitting circuitry.

Figure 6:
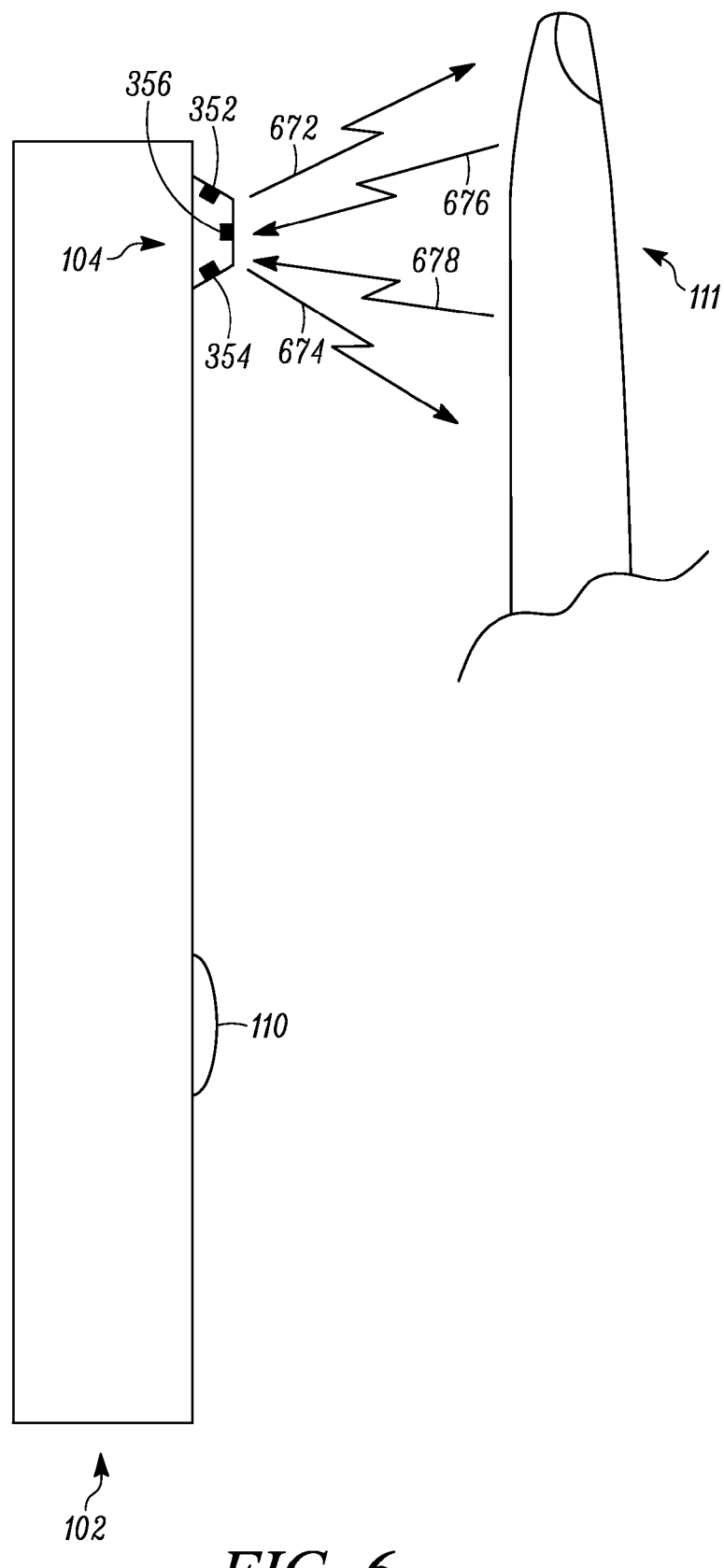
FIG. 6 is a side elevation view of the electronic device, sensing assembly and external object (again shown partially in cutaway) of FIG. 1, illustrating further the manner in which location of the external object is sensed.

Turning to FIG. 6, a side-view of the electronic device 102 and hand 111 of FIG. 1 is provided (with the hand again shown partly in cutaway) to further illustrate how the sensing assembly 104 with its co-located phototransmitters and single photoreceiver is capable of detecting the presence and location of the hand (or a portion thereof, e.g., a finger). As illustrated, when the hand 111 is present and positioned sufficiently proximate the sensing assembly 104, it is often if not typically (or always) the case that the hand will be positioned at a location that is within the range of transmission of light of at least two if not all three of the phototransmitters 352, 354 and 356 of the sensing assembly 104. In the present example, therefore, when light is transmitted from more than one of the phototransmitters, for example, the phototransmitters 352 and 354 as shown, emitted light 672 and 674 from the respective phototransmitters reaches the hand at an angle and is reflected off of the hand so as to generate corresponding amounts of reflected light 676 and 678, respectively. Given the position of the photoreceiver 360 in between the phototransmitters 352, 354, these amounts of reflected light 676, 678 both reach the photoreceiver and are sensed by the photoreceiver as shown.

Figure 7:
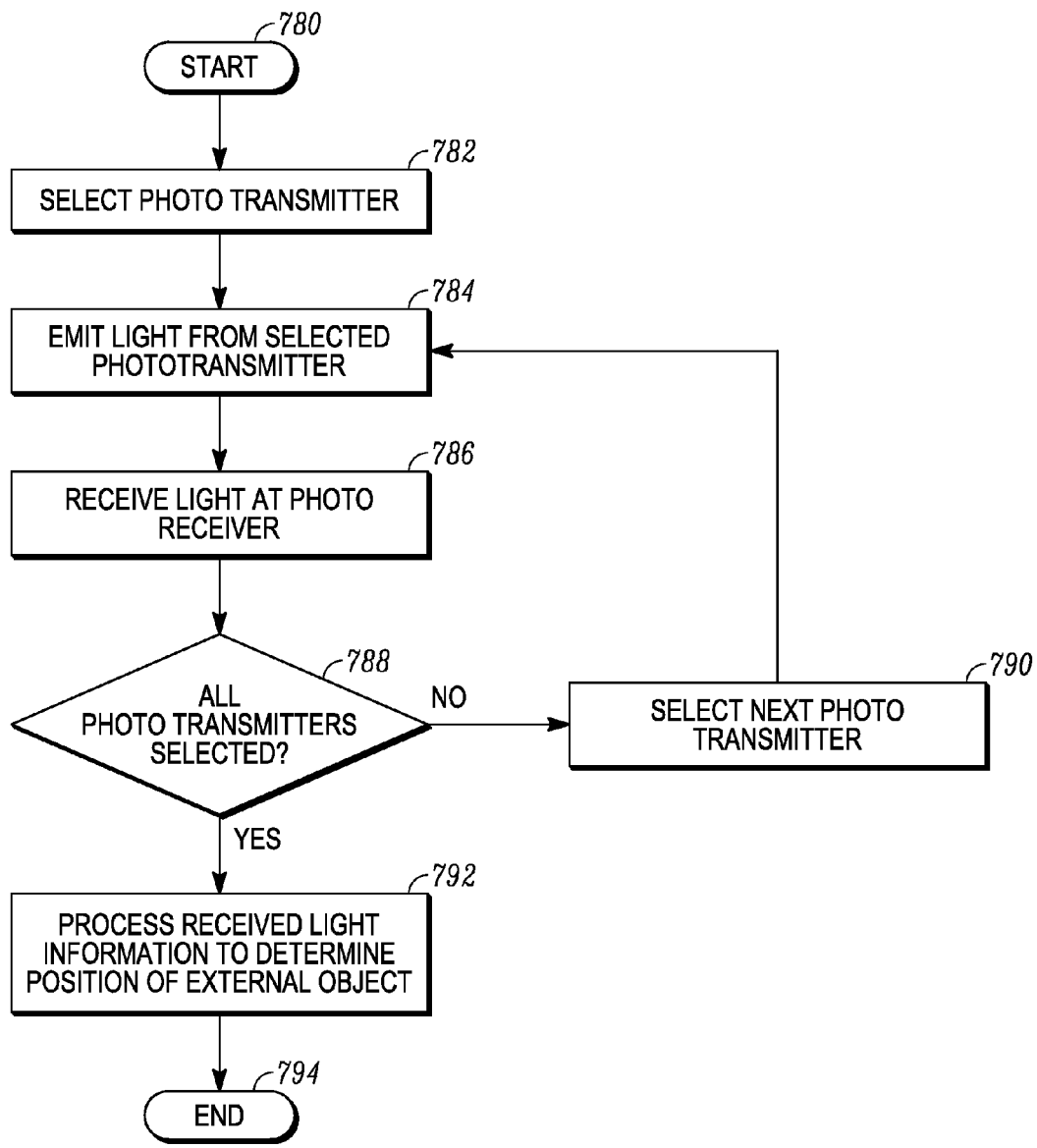
FIG. 7 is a flow chart illustrating exemplary steps of operation of the sensing assembly (and a processing device operating in conjunction therewith), in accordance with at least some embodiments of the present invention.

Referring additionally to FIG. 7, a flow chart is provided that shows in more detail one exemplary manner of operating the components of the sensing assembly 104 so as to determine the location of an external object (e.g., the hand 111), and in which the phototransmitters are each controlled to emit light during each of one or more sequential time periods. More specifically with respect to FIG. 7, after starting operation at a step 780, a first of the phototransmitters of the sensing assembly 104 (e.g., the phototransmitter 352) is selected at a step 782. Then at a step 784, the selected phototransmitter is actuated so that infrared light is emitted from that phototransmitter. That light can then proceed towards the external object (e.g., as the emitted light 672 of FIG. 6) and, upon reaching the external object, some of that light is reflected by the external object (e.g., as the reflected light 676). At a step 786 that reflected light is in turn received by the photoreceiver (e.g., the photoreceiver 360) and the photoreceiver correspondingly sends a signal to a processing device (and/or memory device) that records the received information. At a step 788 it is further determined whether all of the phototransmitters have been actuated. If this is not the case, then another of the remaining phototransmitters (e.g., the phototransmitter 354) is selected at a step 790 and then the steps 784, 786, and 788 are repeated (e.g., such that the emitted light 674 is transmitted and the reflected light 678 is received by the photoreceiver). If however at the step 788 it is determined that all of the phototransmitters have been actuated and, consequently, reflected light signals have been received by the photoreceiver in relation to the light emitted by each of those phototransmitters during a corresponding time period, then at a step 792 the information from the photoreceiver is processed to determine the location of the external object in three dimensional space.

The signal information from the photoreceiver can be processed to determine the location of the external object as follows. The exemplary manner of operation described in FIG. 7 effectively constitutes a form of time division multiplexing in which the various phototransmitters are turned on and off one at a time in a serial manner, such that there are successive time windows or respective portions of each time period associated with the actuation of the different phototransmitters. Given that the external object being sensed is positioned relatively close to the transmitters and photoreceiver, these successive time windows not only constitute the respective windows within which the different phototransmitters are actuated but also constitute the respective windows within which light originating at the respective phototransmitters is emitted, reflected off of an external object, and received at the photoreceiver. Thus, the signals provided from the photoreceiver that are indicative of the intensity/amount of light received by the photoreceiver during any given time window can be compared relative to the intensity/amount of light given off by the phototransmitter known to have emitted light during that time window, and such comparisons can serve as a measurement of the proportion of light emitted by a given phototransmitter that actually returns to the photoreceiver due to reflection by the external object. Such measurements in turn serve as indications of the proximity of the external object to the respective phototransmitters and photoreceiver between which the light is communicated.

Thus, in FIG. 7, the phototransmitters are controlled such that each one emits light during a respective, non-overlapping portion of each of one or more time periods, and the photoreceiver detects measured signals, each of which can be associated with a corresponding one of the phototransmitters based on timing. However, in other cases, the phototransmitters can emit light at different frequencies (wavelengths) or bandwidths and perhaps different colors such that the phototransmitters can be controlled to each emit light at the same time during each of one or more sequential time periods. In this case, receiver circuitry can be provided so as to electronically filter the measured signals by frequency such that each measured signal can be associated with a respective one of the phototransmitters. Another way to differentiate the measured signals when the sensing assembly uses different colors of light emitted by the phototransmitters involves the use of an optical filter which can separate the different color wavelengths of light, with the corresponding use of a matched photoreceiver for each of the colors.

In any case, for such measurements to be more accurate, more particularly, certain additional information can be taken into account, or at least one or more assumptions can be made. For example, such measurements particularly become more accurate as an indication of proximity if one can make an accurate assumption regarding the physical reflectivity of the external object, something which is typically possible to a sufficiently high degree in practice. Additional considerations to take into account can include surface texture, size, shape, consistency, material, object orientation/direction. Predicting absolute reflection levels can be challenging in such environments and can require a calibration procedure. Also, it may be desirable to rely on other technologies which are inherently less susceptible to above factors (such as ultrasonic sensing) to more accurately measure object range and feed that information back to the processor to optimize the sensing assembly performance and improve tracking capabilities. Additionally, the physical positions/orientations of the phototransmitters and photoreceivers also influence the measurements and should be taken into account. Further, angular variations in the transmission and reception of the phototransmitters and photoreceiver also should be taken into account. In this respect, and as already discussed, each of the phototransmitters has a respective center axis of transmission and the photoreceiver similarly has a respective center axis of reception. The transmission intensity from the phototransmitters changes (typically decreases) as the angle between that center axis of transmission and the actual direction of transmission increases, and likewise the reception ability of the photoreceiver also changes (typically decreases) as the angle between the center axis of reception and the actual direction of reception increases. Typically, the degrees to which these quantities vary as one moves away from the center axes of transmission or reception are known properties associated with the phototransmitters and photoreceivers.

Assuming then that a processing device has all of these types of information or at least can rely upon reasonable assumptions concerning these issues, the processing device receiving the signals from the photoreceiver (e.g., the processor 204 of FIG. 2, which also can control actuation of the phototransmitters) is not only able to determine the distance of the external object from the infrared sensing assembly, but more particularly is also able to determine the three-dimensional location of the external object by a type of triangulation calculation (or calculations). More particularly, after the processing device has associated the multiple amplitude (intensity) levels indicated by the photoreceiver as occurring during the different time windows within which multiple phototransmitters have respectively been actuated to transmit light, the processing device can not only determine the amount/intensity of infrared light emanating from each phototransmitter that is reflected back to the photoreceiver but also can compare the relative amounts/intensities of infrared light originating at the different phototransmitters that are reflected back to the photoreceiver, so as to determine the location of the external object relative to the infrared sensing assembly. Generally speaking, as the amounts/intensities of infrared light reflected back to the photoreceiver tend to differ from one another based upon the phototransmitter from which the infrared light originated, this tends to indicate that the external object has shifted to one or another of the sides of the infrared sensing assembly.

For example, if an external object is directly in front of the sensing assembly 104 as shown in FIG. 3, then the intensity of light received by the photoreceiver 360 should be approximately the same regardless of which of the phototransmitters (e.g., which of the phototransmitters 352, 354, 356) is actuated (although at that close range, reflected signals are strong and tend to saturate the receiver). Correspondingly, if the signals received from the photoreceiver 360 are the same or nearly the same during each of three successive time windows during which the three phototransmitters are successively actuated, then processing of this information should determine that the external object is in front of the sensing assembly 104. In contrast, if the received light signal provided by the photoreceiver 360 during the time window corresponding to the actuation of the phototransmitter 352 is much higher than the received light signal provided by the photoreceiver during the time window corresponding to the actuation of the phototransmitters 354 and 356, then processing of this information should determine that the external object is to the side of the sensing assembly 104, closer to the phototransmitter 352 than to either of the other two phototransmitters.

Although the above description of how to determine the location of an external object by way of triangulation particularly envisions the use of information concerning light received at a single photoreceiver originating at multiple phototransmitters (e.g., as is the case in the embodiments of infrared sensing assemblies shown in FIGS. 3 and 4), a similar process is equally applicable where multiple photoreceivers are used to receive multiple different components of reflected light that originated at a single phototransmitter (e.g., as is the case in the embodiment shown in FIG. 5). In all of these embodiments, to the extent that multiple reflected light samples are obtained during a succession of time windows, it is typically assumed that the time windows are sufficiently short that it is unlikely that the external object will have moved significantly during the overall span of time encompassing all of the time windows of interest. Also, while it can be the case that sampling during a single set of time windows (e.g., where only one set of photoemissions has occurred, with each phototransmitter being actuated only once) is adequate to determine the location of an external object, it is also possible that multiple repetitive reflected light samples will be obtained and utilized to determine the location of an external object (e.g., where the processing device not only takes into account multiple samplings of received light occurring as each of the phototransmitters is successively actuated during successive time windows, but also takes into account further samplings of received light as the phototransmitters are successively actuated additional times).

Finally, notwithstanding the general description above of how reflected light information is utilized to determine an external object's location, it will be understood that other additional or different processing steps can also be employed to determine or more closely estimate object location. For example, in some circumstances, it is desirable for background light determinations to be made prior to the making of measurements of reflected light intensity (e.g., before or in between the successive time windows as discussed above), so that background noise can be evaluated and taken into account by the processing device in its calculations, and/or so that the processing device can adjust operational parameters of the phototransmitters and/or photoreceivers such as gain, etc. In this regard, for example, one can consider the disclosures found in U.S. patent application Ser. No. 12/344,760 filed Dec. 29, 2008 and entitled "Portable Electronic Device Having Self-Calibrating Proximity Sensors" and U.S. patent application Ser. No. 12/347,146 filed Dec. 31, 2008 and entitled "Portable Electronic Device Having Directional Proximity Sensors Based on Device Orientation", each of which is hereby incorporated by reference herein, and each of which is assigned to the same beneficial assignee as the present application.

It should be further noted that, in at least some embodiments, operation of the sensing assembly can be limited so as to consider reflected light only originating from certain subset (s) of the available phototransmitters. In some such embodiments where the sensing assembly is implemented in a cellular telephone or PDA, a hand tracking/gesturing offset to a side above the electronic device is enabled by eliminating from the infrared tracking any signals originating from phototransmitters on the side of the sensing assembly that is blocked as a result of the position offset. For example, with respect to the embodiment of FIG. 4, reflected light originating from one of the phototransmitters on a blocked side of the sensing assembly would not be considered in determining the presence/location of an external object (or possibly that phototransmitter would not be actuated to emit light). This manner of operation is workable because, if a human user places a hand above a touch screen and offset to the right so that the hand does not block a viewing of the touch screen, reflection from the left side LED of the sensing assembly is almost nonexistent (point away and opposite to hand location) and the other three LEDs are used for hand tracking and vice-versa (as a result, it is possible to track a hand by positioning a hand to the side).

Figure 8:
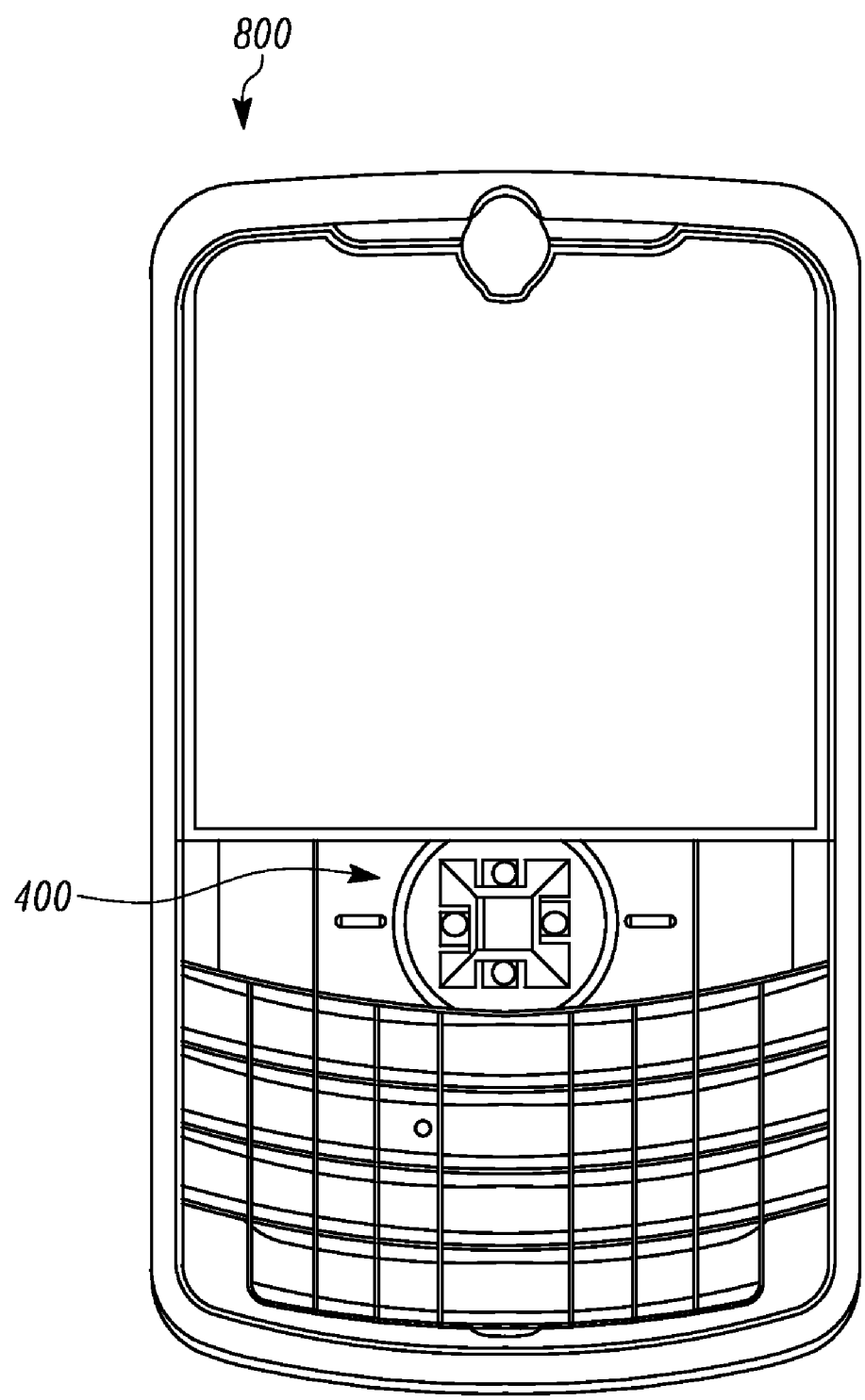
FIGS. 8 and 9 are front elevation views of two exemplary electronic devices that can employ the pyramid-type sensing assembly of FIG. 3, 4, or 5.
Figure 9:
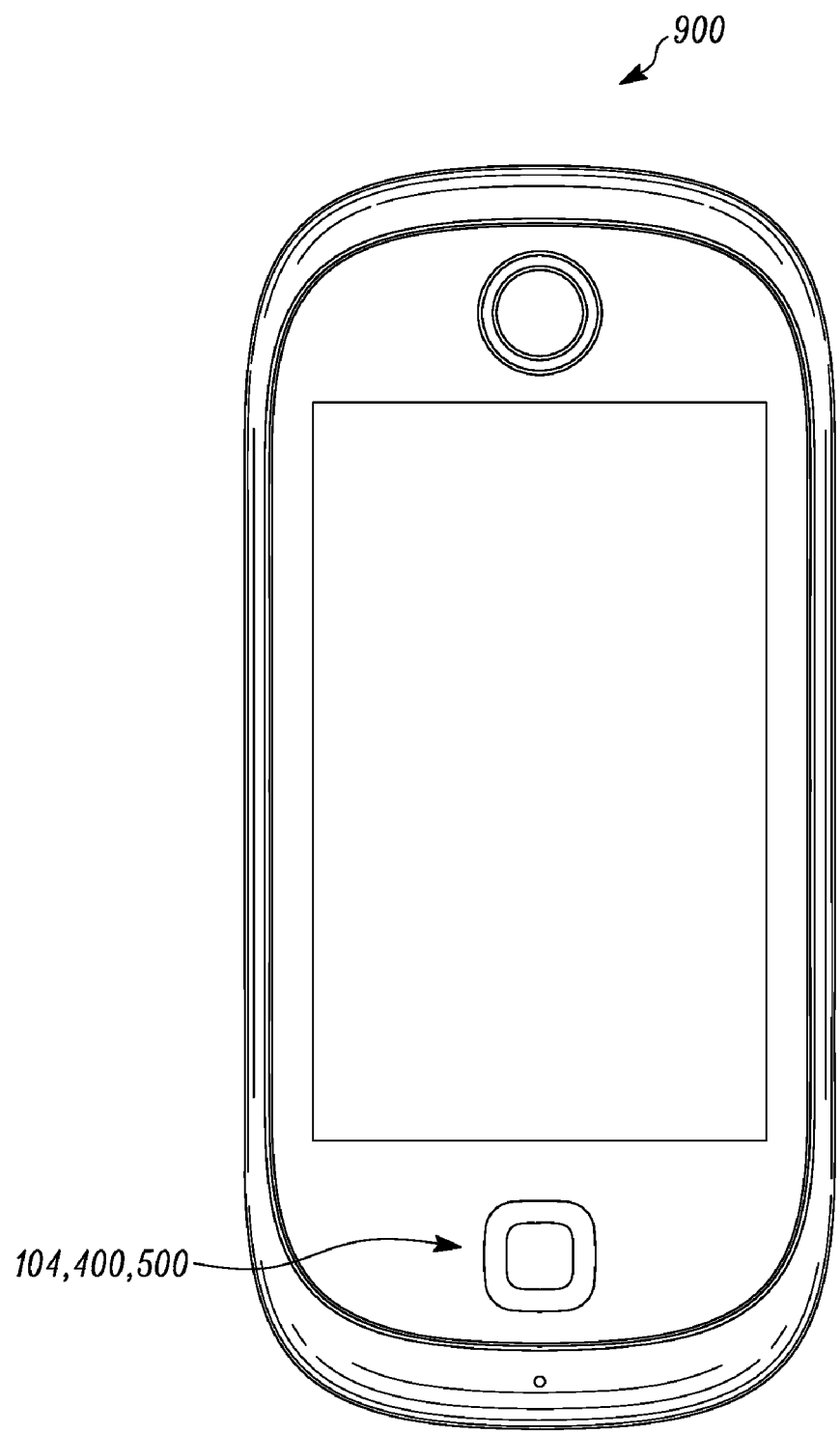

Turning to FIGS. 8 and 9, the positioning of a sensing assembly such as the sensing assemblies 104, 400, and 500 of FIGS. 3-6 can vary depending upon the embodiment and/or the electronic device. As shown in FIG. 8, for example, a sensing assembly such as the sensing assembly 400 can be positioned at a location in the middle of the front surface of an electronic device such as an electronic device 800. In some such embodiments, the sensing assembly 400 can replace the navigation key cluster, such that the pyramid-type housing structure of the sensing assembly serves not only to house the phototransmitter(s)/photoreceiver(s) but also serves as a button/actuator that can be pressed and/or tilted/rotated relative to the front surface of the electronic device, thereby allowing for hands-free and/or touch-based control.

Also, notwithstanding the embodiment of FIGS. 1 and 6, a sensing assembly can be implemented at either end or along any edge of any given electronic device depending upon the embodiment. For example, as shown in FIG. 9, a sensing assembly 104, 400, 500 such as that of the FIGS. 3-5 can be implemented at the opposite end of an electronic device (e.g., near the bottom of the front surface) 900 rather than at the end shown in FIGS. 1 and 6 (e.g., near the to of the front surface). The electronic device 900 also is intended to illustrate how a sensing assembly such as any of those described above can be implemented on an electronic device in which the entire front surface is a glass or plastic/transparent video screen or touch screen. It should be noted that blocking problems of the type discussed above (e.g., involving hand positioning) typically do not occur when the sensing assembly is at the bottom of a touch screen as shown in FIG. 9, albeit in such embodiments it can be desirable to tilt the sensing assembly slightly toward a point nearer to the center of the phone (or to use a lens to achieve such effect).

Although the above-described embodiments all envision the implementation of one or more photoreceivers and phototransmitters along (or recessed within) different walls of a pyramid-type structure, where the respective orientations of those photoreceiver(s)/phototransmitter(s) correspond to the orientations of the respective surfaces of the pyramid-type structure in which those devices are implemented, the present invention should also be understood as encompassing numerous additional embodiments differing from those described above in certain aspects. For example, in at least some embodiments, the photoreceiver(s)/phototransmitter(s), while being held together in a manner by which the various devices maintain relative angular positions that are the same as (or similar to) those described above, nevertheless are not housed within any particular pyramid-type housing structure with specific walls as described above. Indeed, the present invention is intended to encompass embodiments in which there are merely several photoreceiver(s)/phototransmitter(s) that are assembled to one another but have no walls or structures positioned in between those devices.

Also, the above-described embodiments envision particularly the implementation of multiple (e.g., three or more) devices of one type (e.g., phototransmitters or photoreceivers) surrounding a single device of another type (e.g., a photoreceiver or phototransmitter), where the devices of the one type are equally-spaced apart from one another around the device of the other type, where the devices of the one type are all equally spaced apart from the device of the other type, and where the devices of the one type are angularly offset in their orientation relative to the orientation of the device of the other type by a consistent angular amount (e.g., by the angle α or β), other embodiments are also possible. For example, in some alternate embodiments, the devices of the one type need not all be equally spaced apart from one another about the device of the other type, need not all be equidistant from the device of the other type, and/or need not all be offset in their orientation relative to that of the other device by the same amount.

Figure 10:
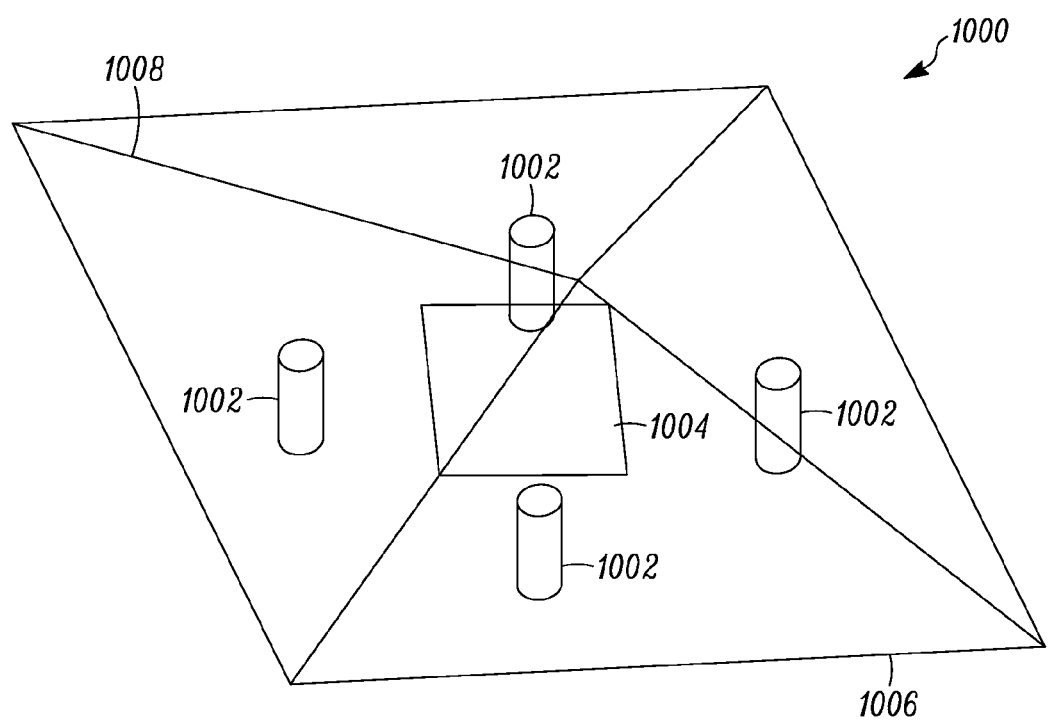
FIG. 10 shows a further alternate embodiment of a sensing assembly that differs from that of FIG. 4 in that, instead of being a pyramid-type sensing assembly, the sensing assembly employs a lens that results in the sensing assembly experiencing operational behavior similar to that experienced by pyramid-type sensing assembly of FIG. 4.

In this regard, one exemplary alternate embodiment of a sensing assembly 1000 is shown in FIG. 10. As shown, in this embodiment, the sensing assembly 1000 like the sensing assembly 400 of FIG. 4 has four phototransmitters 1002 spaced around a single photoreceiver 354. However, in contrast to the sensing assembly 400, the phototransmitters 1002 each are vertically oriented so as to have center axes of transmission that are parallel to the center axis of reception of the photoreceiver 354. That is, the phototransmitters 1002 are not at all offset in their rotational orientation relative to the photoreceiver. Further, a housing 1006 within which the phototransmitters 1002 and photoreceiver 1004 are supported does not necessarily have a pyramidal shape with any inclined surfaces.

Notwithstanding these differences between the sensing assembly 1000 and the sensing assembly 400, the sensing assembly 1000 nonetheless is able to transmit light and receive reflected light (as reflected by an external object) as if the phototransmitters were rotationally offset relative to the photoreceiver insofar as the sensing assembly 1000 additionally includes a pyramid-shaped lens or prism 1008 (or possibly multiple lenses in a pyramid-type shape) provided atop the phototransmitters and photoreceiver (or possibly only over one or more of those devices) that refracts/bends the transmitted light exiting the sensing assembly/lens and/or refracts/bends the received light incident upon the sensing assembly/lens, such that the overall transmission and reception of light out of and into the sensing assembly proceeds in substantially the same manner as is experienced by the sensing assembly 400. In some circumstances, the lens 1008 can be microfilm for beam bending, particularly if the involved angles are small (e.g., 10 to 5 degrees) and the photo-LEDs have relatively narrow transmission ranges (e.g., plus or minus 30 degrees). Although the lens 1008 is shown to be of a pyramid-type form that includes four inclined sides sloping away from a tip of the lens (in this case, this tip can be considered a central surface of the lens), in other embodiments, the lens can take a form that is more similar to that of the pyramid-type structures described above in relation to FIGS. 3-5, in which the tip portion of the pyramid is missing such that there exists a central surface that is more extensive (e.g., such as the top surfaces 348, 482 and 510) away from which the inclined surfaces slope.

Figure 11:
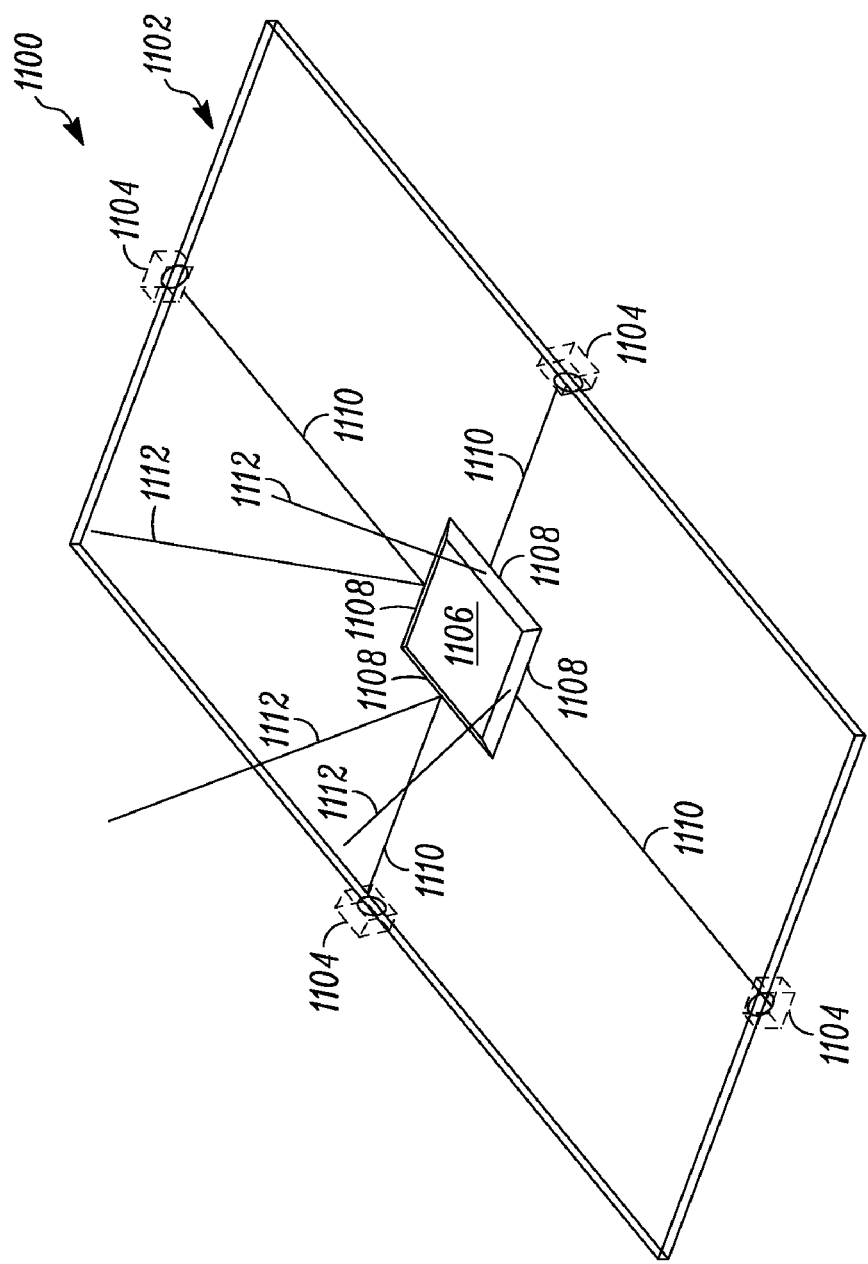
FIG. 11 shows an additional alternate embodiment of sensing assembly differing from those of FIGS. 1-6 and 8-10, which includes a prism/mirror structure that receives light from a plurality of different respective phototransmitters positioned at respective locations apart from one another and apart from the location of the prism/mirror structure.

The present invention further is intended to encompass additional embodiments of sensing assemblies that are particularly useful for implementation in certain types of electronic devices. Referring particularly to FIG. 11, a further sensing assembly 1100 is shown to be implemented in relation to a glass (or transparent plastic) video screen or touch screen 1102 as is common in certain types of electronic devices, including for example the electronic device 900 of FIG. 9. As shown, in the embodiment of FIG. 11, the sensing assembly 1100 includes four transceivers 1104, each of which includes a respective phototransmitter and a respective photoreceiver, and the respective transceivers are respectively positioned at the midpoints of each of the four side edges of the screen 1102, respectively. Further as shown, the sensing assembly 1100 also includes a pyramid-type formation 1114 that is formed as part of (or positioned just beneath) the screen 1102. The pyramid-type formation 1114 includes four inclined surfaces 1108 extending from the four sides of a square top (horizontal) surface 1106, where each of the inclined surfaces slopes downwardly from the top surface towards one of the respective edges of the screen 1102.

The sensing assembly 1100 of FIG. 11 operates as follows. In a first manner of operation, light is transmitted from each of the phototransmitters of the respective transceivers 1104 via respective optical waveguides 1110 through the screen 1102 (or just beneath the screen, parallel to its surface) toward the respective one of the inclined surfaces 1108 closest to that respective transceiver. Upon reaching the inclined surfaces, the light is reflected outward from the sensing assembly 1100 (and thus from the electronic device on which it is implemented) at various angles depending upon the slopes of the inclined surfaces 1108, with the light transmission being centered about respective center axes of transmission 1112. Thus, transmitted light emanates from the sensing assembly 1100 in much the same manner as if the light had been emitted directly from phototransmitters arranged along the sides of a pyramid-type structure as shown in FIG. 4. After the light is emitted about the center axes of transmission 1112, it can then be reflected off of an external object such as the hand 111 of FIG. 1. Portions of the reflected light eventually are received by one or more of the photoreceivers associated with the respective transceivers 1104, and thereby the reflected light is sensed.

Further variations of the sensing assembly 1100 are also possible. For example, in one alternate embodiment, rather than reflecting light to be transmitted out of the sensing assembly, the inclined surfaces 1108 of the pyramid-type formation 1114 instead are intended to reflect incoming reflected light back toward the transceivers 1104, at which are located respective photoreceivers. In such embodiments, the phototransmitters of the transceivers 1104 can be configured to transmit light directly outward (e.g., perpendicular to the surface of the screen 1102) at the locations of the transceivers, with that light in turn being partly or entirely reflected by an external object back toward the pyramid-type formation 1114. In further alternate embodiments, rather than employing four transceivers that each have a respective phototransmitter and a respective photoreceiver, only four phototransmitters or four photoreceivers are provided at the locations of the transceivers 1104 shown in FIG. 11. In such embodiments, where four phototransmitters are positioned at the edges of the screen 1102, a photoreceiver can be positioned along the top surface of the pyramid-type formation and, where four photoreceivers are positioned at the edges of the screen, a phototransmitter can be positioned along the top surface of the pyramid-type formation.

Each of the embodiments described above in relation to FIG. 11 are particularly advantageous insofar as they allow for the use of a pyramid-type formation such as the pyramid-type formation 1114 having a height that is considerably less than the heights of the pyramid-type formations of the sensing assemblies 104, 400, 500 described above. Thus, there is no need (or much less need) to have a housing structure protruding outward from the surface of the electronic device. Further the pyramid-type formation 1114 can be transparent and thus substantially the same in appearance as the remainder of the screen 1102. Thus, the use of such pyramid-type formations such as the formation 1114 can be particularly advantageous for use in electronic devices where it is desired that the front surface of the device be a large flat video screen or touch screen, uninterrupted by bumps or regions where the video screen or touch screen is unable to display information.

It should be noted with respect to the sensing assembly embodiments of FIGS. 10-11 that, even though the structures employed are different to some extent than those shown in FIGS. 1-6, each of these embodiments nevertheless can be operated in essentially the same manner as is described with reference to FIG. 7. Further, although the lens 1008 of FIG. 10 and the pyramid-type formation 1114 of FIG. 11 are four-sided pyramid-type structures, in other embodiments other pyramid-type structures (e.g., tetrahedral structures) can also be employed. In some cases, a pyramid structure is not necessary, because the phototransmitters and/or photoreceivers can be appropriately tilted such that light is emitted in desired directions.

Notwithstanding the above discussion, the present invention is intended to encompass numerous other embodiments as well. For example, in some other embodiments, there are only two phototransmitters (and one or more photoreceivers) or only two photoreceivers (and one or more phototransmitters). In other embodiments, there are more than four phototransmitters (and one or more photoreceivers), or more than four photoreceivers (and one or more phototransmitters). Also, while in many embodiments of the present invention the sensing assembly is intended to be mounted to an electronic device in a fixed/stationary manner, which can be advantageous because such manner of mounting can be easily achieved without the need for many complicated components, in some other embodiments it is possible that the sensing assembly is mounted to an electronic device in a tiltable, rotational, or translatable manner to allow for tilting, rotation and/or translation of the sensing assembly relative to the remainder of the electronic device (typically, such tilting, rotation and/or translation would be limited in nature, e.g., as discussed above in the example where the sensing assembly replaces the navigation key cluster). Additionally, while in some embodiments discussed above such as those of FIGS. 3 and 4 the photoreceiver (photodiode) is placed inside the pyramid-type structure (e.g., at the center of the structure), in alternate embodiments the photoreceiver (photodiode) can be positioned on top of or outside of the pyramid-type structure or its center.

Further, although the embodiments discussed above envision a single infrared sensing assembly being implemented on a given electronic device, it is also possible in some other embodiments that multiple infrared sensing assemblies will be implemented on a given electronic device. For example, in some embodiments of electronic devices, two sensing assemblies positioned on diametrically-opposed outer surfaces of the electronic device can be employed so as to allow for the detection of the presence and location of external objects on both sides of the electronic device. Additionally, although the particular tetrahedron and four-sided pyramid structures are described above, it should be understood that other embodiments employing similar structures having multiple inclined surfaces and the like are also encompassed within the present invention. Further, while the use of a lens/pyramid structure for the purpose of bending/refracting light is discussed above with respect to certain embodiments, the bending/refracting of light can also be achieved by having an optical diode placed in a tilted package, or having a tilted lens attached to it (indeed, in some circumstances an infrared photo-LED or photodiode for use as a phototransmitter or photoreceiver will be manufactured by a vendor with such tilted characteristics, which can for example be referred to as "top shoot", "side shoot", or "tilted shoot", among other things).

Also, while in the embodiments discussed above it is envisioned that the sensing assembly will be implemented in conjunction with an electronic device or other device, where the electronic device or other device will include the processor and/or other components appropriate for controlling actuation of the phototransmitter(s) of the sensing assembly, for receiving signals indicative of the receiving of reflected light by the photoreceiver(s), and for determining the presence and location of external object(s) based upon those received signals, in other embodiments it is possible that the sensing assembly will itself include processor and/or other components as are appropriate (e.g., memory device(s), battery/power source device(s), and input/output terminal(s), etc.) for allowing the sensing assembly to operate by itself in terms of controlling the actuation of its phototransmitter(s), monitoring the operation of its photoreceiver(s), making presence/location determinations, and communicating such presence/location information to other external devices. In some such embodiments, the sensing assembly itself has one or more terminals/ports/interfaces suitable for allowing the sensing assembly to communicate with remote devices via wired or wireless networks including by way of internet-type networks.

Embodiments of the present invention allow for an electronic device, with an appropriate sensing assembly, to achieve beneficial manners of operation based upon the information obtained regarding the presence and location of external object(s). For example, in some electronic devices such as cellular telephones, the presence and location of a human user's phone is of interest and can be used to govern or influence one or more operations of the phone. To begin, the use of a sensing assembly such as those described above can allow a mobile phone to detect whether a human user's hand or ear are proximate a right side of the phone or a left side of the phone, and thereby allow for appropriate adjustments to phone operation. Further for example, the volume of a phone speaker can be automatically adjusted based upon the sensed position of a human user's head. Sensing assemblies such as those described above also can enable tracking movement without blockage when placing/tracking a hand above the phone offset to the left or right side of the phone.

Also for example, through the use of a sensing assembly such as one or more of those discussed above, it is possible to enable an electronic device to sense and recognize hand gestures that signify user selections or commands. Further for example in this regard, sensed movement of a finger of a human user above the front surface of an electronic device can signify a command by the human user that an image or content displayed on the electronic device be paused/frozen (e.g., to facilitate sending or sharing of the image/content), changed, free/selected (e.g., that a page of information be turned so that a different page of information is displayed), shared, etc., or that a cursor displayed on a screen be moved (e.g., a command such as that often provided by a "mouse"), or that a zoom level or pan setting regarding an image (e.g., a map or photograph) be modified. In this manner, such infrared gesturing can serve as a substitute for a touch screen, where a user need not actually touch the surface of the electronic device to execute a command (albeit the system can still be implemented in a manner that also allows for commands to be recognized when touching does occur). By eliminating the need to touch a screen, disadvantages potentially associated with touching (e.g., fingerprints and other smudging of a video display screen or germ transmission) can be reduced.

In some circumstances, different hand movements or repeated hand movements sensed by way of the sensing assembly of an electronic device can be understood as constituting a first command that a particular variable operational characteristic be selected (e.g., that a volume control icon appear on the video screen of the electronic device) followed by a second command modifying a setting of the variable operational characteristic (e.g., that the volume be set to a particular level). Particularly in this regard, for example, because infrared sensing assemblies of the type described above are capable of detecting both movements across the assemblies (e.g., horizontal xy-plane movements) as well as movements toward or away from the assemblies (e.g., vertical z-axis movements), a horizontal-plane gesture can be followed by a vertical axis gesture as an indication of particular commands. Further for example, using such gestures, the horizontal gesture could precipitate a volume (or zoom) adjustor icon to become available while the vertical gesture could in fact cause adjustment in the volume (or zoom) to a desired level. Alternatively, where multiple repeated hand movements are anticipated, the failure of a second or successive hand movement to occur can be interpreted as a command that some other action be taken (e.g., that a cursor or image be recentered or otherwise repositioned).

One example of operation encompassing a number of the above-described considerations would be as follows. Suppose a user placed a hand approximately six inches above a touch screen and to the right side of a cellular telephone on which an infrared sensing assembly was provided. Immediately, in this instance, the phone might respond by placing a cursor on the right side edge of the touch screen corresponding to the hand location. However, assuming that the user hand was kept stationary in that location for one second, then the phone might further act to re-center/map the cursors to the middle of the touch screen (corresponding to the hand being near the right side of the phone). As discussed above, given placement of the hand on the right side of the phone, the phone might operate to track the hand by operating the sensing assembly so that only certain portions of reflected light (e.g., as generated by certain ones of the phototransmitters, for example, three out of four of the phototransmitters of the sensing assembly of FIG. 4, but not the phototransmitter pointing toward the left side of the phone) were considered. Once the user completed an operation of interest (e.g., panning or zooming), the user's hand might remain stationary again and this could signify that the current image should be paused/frozen.

In some embodiments the operation of existing other sensors of an electronic device (e.g., an accelerometer capable of detecting a physical tapping of a navigation key cluster) can be coordinated with the operation of an infrared sensing assembly such as those described above. Indeed, depending upon the embodiment, a variety of other sensors in addition to an infrared sensing assembly can be utilized in detecting commands in a navigation mode of operation and/or to adjust an infrared range accordingly in switching between an infrared sensing mode of operation and a touch-based mode of operation. For example, in some embodiments in which the sensing assembly is implemented as a navigation key cluster, navigation can be achieved by a hand gesture above the sensing assembly (not touching the sensing assembly), followed by pressing of the center of the navigation device to achieve selection. In such a case, infrared reception would go from a maximum level (where the finger was near the sensing assembly) to a minimum level (where the finger blocks reception entirely), and such a maximum to minimum occurrence would be interpreted as constituting a selection input. Alternatively for example, a tap as sensed by another sensor could then precipitate the electronic device's anticipating an imminent user command that would be sensed via the infrared sensing assembly. Also, in some circumstances, sliding of an external object such as a finger directly along the sensing assembly (involving touching) can be recognized as a command.

Electronic devices implementing sensing assemblies such as those described above can be utilized in other contexts as well. For example, an electronic device implementing a sensing assembly can be operated so as to recognize the proximity of a surface (e.g., a desktop) to the electronic device, such that the electronic device when positioned and moved over the surface can be utilized as a mouse. Relatedly, by sensing the positioning/tilting of a human user's hand relative to an infrared sensing assembly on an electronic device, mouse-type commands can also be provided to the electronic device. In such applications, it can be particularly desirable to utilize phototransmitters having narrow angular ranges of transmission to allow for high sensitivity in detecting the tilting of a user's hand.

Also, in some embodiments, operation of the sensing assembly itself can be controlled based upon sensed information concerning the location of external object(s). For example, in some cases, the sampling rate (e.g., in terms of the frequency with which the various phototransmitters of a sensing assembly such as the sensing assembly 104 are actuated to emit light) can be modified based upon the proximity of the user, so as to adjust the sensitivity of the location detection based upon the proximity of the user. Indeed, while the manner of operation described with respect to FIG. 7 envisions that the different phototransmitters of a given sensing assembly will be actuated in succession rather than simultaneously, in some cases it may be desirable to actuate all of the phototransmitters simultaneously to increase the overall intensity of the light emitted by the sensing assembly, which can increase the overall amount of reflected light that makes its way back to the photoreceiver and thereby make it possible to sense the proximity of an external object even though the object is a fairly large distance away from the sensing assembly. For example, the range of proximity detection of a sensing assembly can be increased from six inches where the phototransmitters are successively actuated to two feet where all of the phototransmitters are actuated simultaneously (this can be referred to as "super-range proximity detection").

More specifically with respect to the detection of gestures, a sensing assembly such as sensing assembly 104, 400, or 500, in conjunction with a processor, such as processor 204, can be used to detect one or more of various basic gestures, where each gesture is a predefined movement of an external object (such as a user's hand or thumb or finger) with respect to the electronic device, and to control operation of the electronic device based upon the detected gesture. Operation of the electronic device can also be based upon a determination of a location of the object at various times during the gesture. The sensing assembly and processor can detect the presence and movement of objects in a three dimensional space around the sensing assembly, and so the various different gestures can be defined as movements in this three dimensional space rather than in a one or two dimensional space.

The various predefined basic gestures to be detected can include for example, a push/pull gesture (negative or positive z-axis movement), a slide gesture (xy planar movement), a hover gesture (stationary placement), and a tilt gesture (rotation of the external object about a corresponding pitch, roll, or yaw axis), as well as different combinations of these four basic gestures. The sensing assembly and processor can be operable to run a specific routine to detect a corresponding one of these gestures, and/or to detect and distinguish between two or more predefined gestures. Each predefined gesture (including a combination gesture) can be associated with a respective predetermined control operation of the electronic device. In some cases, determined locations of the object at corresponding times of a gesture can be used such as to control a particular setting of a control operation.

As mentioned above, the gestures can be defined to be performed in a touchless manner (i.e., without touching a display screen or the like of the electronic device), although some can involve touching of the electronic device. Further, the gestures can be defined to have a predetermined start or end location, or other orientation with respect to the electronic device or sensing assembly. For example, certain gestures can be defined to be performed in an "offset" manner with respect to a display screen, in order for the display screen to remain unobstructed by movement of the object.

Figure 12:
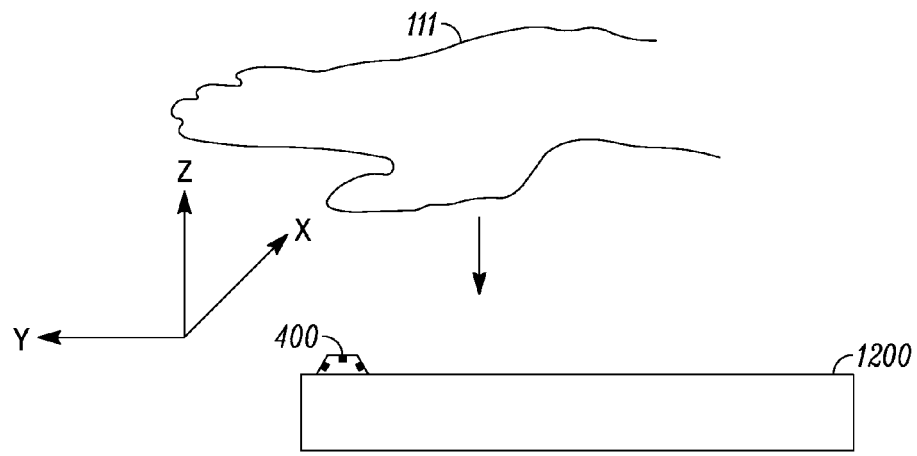
FIGS. 12-14 sequentially illustrate a push gesture performed by movement of a hand toward a electronic device.
Figure 13:
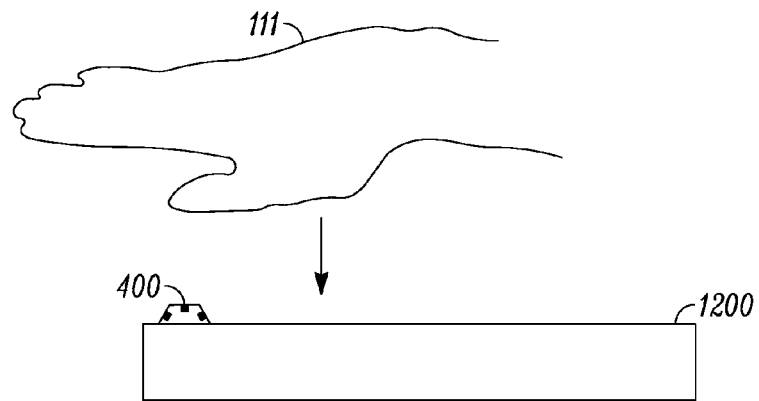
Figure 14:
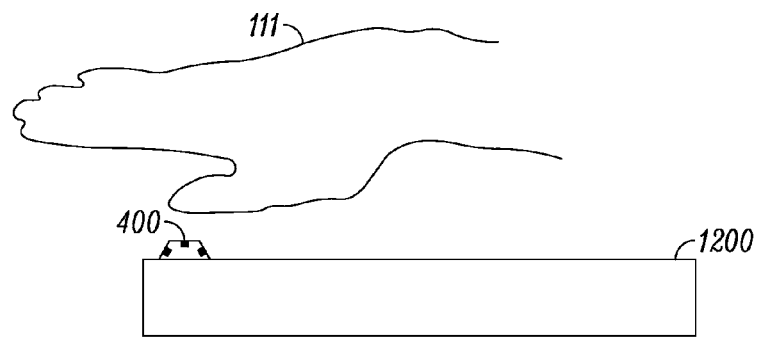

With respect to examples of predefined gestures, FIGS. 12-14 sequentially illustrate a push gesture performed by movement of an object, in this case a user's hand 111, toward an electronic device 1200 (such as a mobile device) having a sensing assembly such as sensing assembly 400. More specifically, using the three dimensional (3D) coordinate system illustrated, a push gesture can be defined to be movement of an object in a negative z direction from a first position as shown in FIG. 12, to a second position closer to the sensing assembly 400, such as shown in FIG. 14. In this case, the user's hand is shown as being generally centered above the sensing assembly 400, although this is not necessary for the detection of a push gesture. Similarly, a pull gesture can be defined to be movement of an object in a positive z direction from a first position close to the sensing assembly to a second position farther away from the sensing assembly. As described below, a z distance calculation routine can be utilized to determine the approximate distance between the object and the electronic device during one or more time periods of the push or pull gesture.

Figure 15:
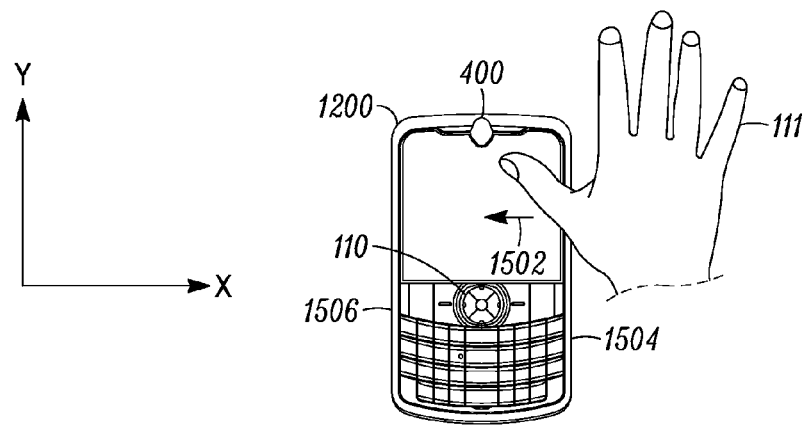
FIGS. 15-17 sequentially illustrate a slide gesture performed by movement of a hand across a electronic device.
Figure 16:
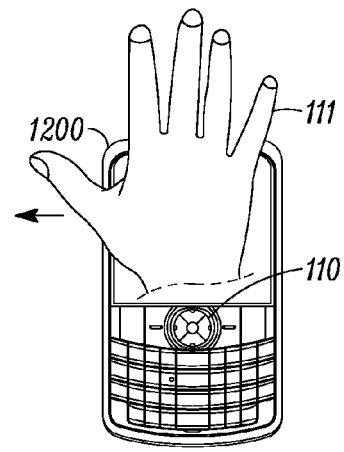
Figure 17:
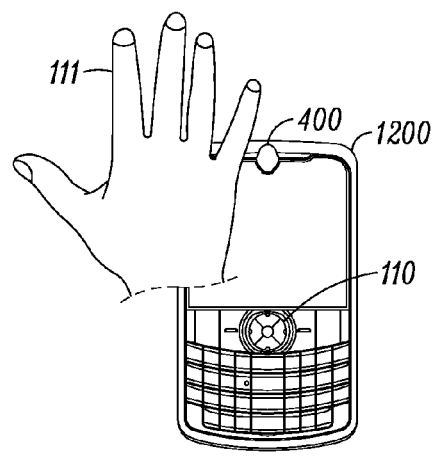

Generally a slide or swipe gesture can be defined to be movement of an object in a defined plane across the electronic device, and preferably at a generally constant distance from (typically above) the electronic device. For example, FIGS. 15-17 sequentially illustrate a side-to-side slide gesture performed by movement of a user's hand 111 in the xy plane and in a negative x direction (as indicated by arrow 1502) from a first side 1504 of electronic device 1200, across the electronic device and preferably across the sensing assembly 400, to a second side 1506 of the electronic device 1200. Similarly, a top-to-bottom (or bottom to top) slide gesture can be defined by movement of an object across the sensing device such as from a top side of the electronic device in a negative y direction to a bottom side of the electronic device, or in a positive y direction from bottom to top. Various other slide gestures can also be defined which occur in a specified direction in the defined xy plane. A partial slide gesture can be defined to be movement that extends only partially across the electronic device. A general xy location of the object with respect to the electronic device can be determined at different time periods of the slide gesture.

A hover gesture can be defined to be no movement of an object, such as a downward facing hand, for a certain period of time, such as one or more seconds. A cover gesture can be defined to be a special case of a hover gesture, such as where an object such as a cupped hand is touching the electronic device and substantially covers the sensing assembly. A tilt gesture can be defined to be rotation of an object such as a hand about a roll axis (x axis), a yaw axis (y axis), or a pitch axis (z axis).

Combination gestures, such as a dive or swoop gesture, can be defined to be a push gesture immediately followed by a tilt gesture. For example, a dive gesture can be defined by an object such as a hand which moves closer to the sensing assembly with fingers initially extended generally towards the electronic device (push gesture in −z direction) and which then changes to fingers extended generally parallel to the electronic device (in the xy-plane via a tilt gesture such as around an axis parallel to the x axis).

Certain gestures can be defined to be performed by a hand in a specific hand or finger configuration and the sensing assembly and processor can further operate to detect in certain circumstances a specific hand configuration in conjunction with a predefined gesture. For example, one such gesture can be a slide gesture performed by a hand palm side face the sensing assembly and with two extended fingers (such as in a peace sign configuration). Various other gestures and hand configurations can also be defined.

Basically in order to detect gestures, one or more phototransmitters of the sensing assembly are controlled by the processor to emit light over sequential time periods as a gesture is being performed, and one or more photoreceivers of the sensing assembly receive any light that is emitted from a corresponding phototransmitter and is then reflected by the object (prior to being received by a photoreceiver) to generate measured signals. The processor, which preferably includes an analog to digital converter, receives these measured signals from the one or more photoreceivers, and converts them to a digital form, such as 10 bit digital measured signals. The processor then analyzes all or a portion of these digital measured signals over time to detect the predefined gesture, and to perhaps determine a specific hand configuration, and to perhaps determine one or more relative locations or orientations of the object during one or more corresponding times of the gesture. The analysis can be accomplished by determining specific patterns or features in one or more of measured signal sets or modified or calculated signal sets. In some cases, the timing of detected patterns or features in a measured signal set can be compared to the timing of detected patterns or features in other measured signal sets. In some cases, distances along the z axis, xy locations, and/or the amplitudes of detected patterns or features can be determined. Other data manipulation can also be performed. The predefined basic gestures can be individually detected or can be detected in predefined combinations, allowing for intuitive and complex control of the electronic device.

Figure 18:
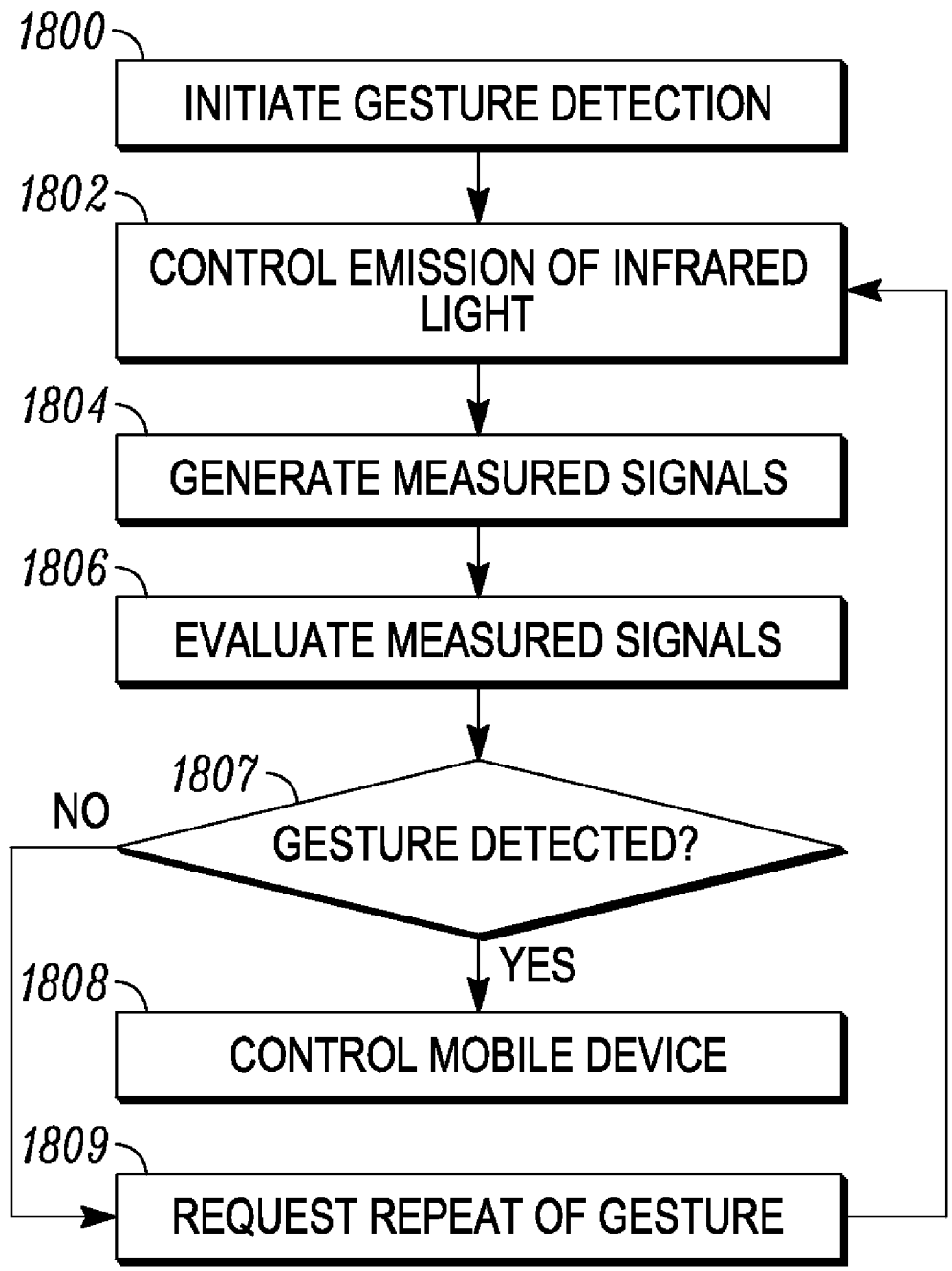
FIG. 18 is an exemplary method for detecting a gesture.

FIG. 18 is an exemplary method for detecting a predefined basic gesture and can be used with a sensing assembly like any of those described above, including one having multiple phototransmitters and at least one photoreceiver, or one having multiple photoreceivers and at least one phototransmitter, or one having multiple transceivers (with or without a pyramid structure). In the case of multiple phototransmitters which can surround a single photoreceiver, as described above, each of the phototransmitters is oriented such that it emits infrared light outward away from the electronic device about a corresponding central transmission axis, with each central transmission axis extending in a different direction with respect to the sensing assembly and electronic device. In this manner, a large portion of the volume adjacent to the electronic device can be reached by emitted infrared light in order to allow the movement of an object to be tracked across this volume. A similar ability to track movement of an object exists with a sensing assembly having multiple photoreceivers which can surround a single phototransmitter or with a sensing assembly having multiple transceivers (wherein each transceiver essentially includes a phototransmitter co-located with a photoreceiver).

In particular, the exemplary method begins at step 1800, which is an initiation for indicating that a gesture detection routine should be started. Initiation can be accomplished in a number of ways such as when a user launches or focuses on a particular application on the electronic device, a particular portion or step of an application, or when a user indicates gesture detection should be initiated using one of the various input devices of the electronic device in a predetermined manner, or by a combination of these steps. The processor can be capable of performing various gesture detection routines individually or simultaneously.

At a step 1802, the processor controls the phototransmitter(s) to control the timing and intensity of the infrared light emitted by the phototransmitter(s). For example, if the sensing assembly includes a single phototransmitter, the phototransmitter is controlled to emit light during each of multiple sequential time periods as the external object moves in the specified pattern of movement. If the sensing assembly includes multiple phototransmitters, each of the phototransmitters can be controlled to emit light during a respective, non-overlapping, portion of each of multiple sequential time periods as the external object moves in the specified pattern of movement. In this manner, each measured signal generated by a photoreceiver can be associated with a respective one of the phototransmitters. The length of a time period is preferably selected such that the amount that an object moves during the time period is negligible as compared to the total movement of the object for a complete gesture. In some cases as described above, the phototransmitters can each emit light at different frequencies (wavelengths), or bandwidths, and these phototransmitters can then be controlled to transmit light at the same time during each of the time periods. The benefit of the phototransmitters transmitting at the same time is enhanced speed.

At a step 1804, measured signals indicative of intensity of received light are generated by the photoreceiver(s). For example, assuming that the sensing assembly includes multiple phototransmitters and at least one photoreceiver, then for each phototransmitter and for each time period, a corresponding measured signal can be generated by the photoreceiver which is indicative of a respective amount of infrared light which originated from that corresponding phototransmitter during that corresponding time period and was reflected by the external object prior to being received by the photoreceiver. If the phototransmitters transmit light at the same time, then the measured signals can be decoded such as by frequency filtering or the like, in order to discern which signals originated from each of the different phototransmitters. This can also be accomplished with the use of multiple photoreceivers.

In another example, wherein the sensing assembly includes multiple photoreceivers and at least one phototransmitter, for each of the plurality of photoreceivers and for each of the plurality of sequential time periods, a corresponding measured signal can be generated which is indicative of a respective amount of infrared light which originated from the phototransmitter during the corresponding time period and was reflected by the external object prior to being received by the corresponding photoreceiver.

As described below, the intensity of the emitted infrared light can be controlled to ensure that the photoreceivers are not saturated so that the measured signals provide useful information.

The measured signals are preferably digitized by an A/D converter to provide sets of digital measured signals, with each digital measured signal set corresponding to a respective phototransmitter (such as in the case of multiple phototransmitters and a single photoreceiver) or a respective photoreceiver (such as in the case of multiple photoreceivers and a single phototransmitter). The digital signals can also be corrected to take into account non-zero values obtained when a corresponding phototransmitter is not emitting light. This entails the acquisition of one or more measured signals when no phototransmitter is transmitting and the subtraction of this value from the digital values to produce compensated digital signal values. For example, assuming use of a sensing assembly such as sensing assembly 400 shown in FIG. 4, which includes a single photoreceiver 492 surrounded by four phototransmitters 484, 486, 488, and 490, a background reading from the photoreceiver 492 can be initially obtained when no phototransmitter is transmitting, and then each phototransmitter can be pulsed on one at a time and four corresponding measured intensity signals or readings are obtained corresponding to one time period. These four readings can be compensated by subtracting the background reading and this procedure can be repeated for each subsequent time period.

In order to provide meaningful measurements through an entire range of possible object locations, an automatic power control scheme can be implemented to control the intensity of emitted infrared light in step 1802 to avoid saturation of the photoreceiver(s). The following description again assumes use of sensing assembly 400 as shown in FIG. 4, i.e., with multiple transmitters and a single photoreceiver, however, analogous operation applies to other sensing assembly embodiments. Basically, the power control scheme operates by obtaining corresponding measured signals with the phototransmitters operating at one of various power settings during at least one time period and checking that the photoreceiver is not producing signals at the top of an output range during this time period. For example, three different power settings can be employed for the phototransmitters: a high setting, a medium setting, and a low setting. Respective measured signals from the photoreceiver corresponding to each of the phototransmitters are first obtained with the phototransmitters controlled to emit light at the high setting during a time period (where the phototransmitters can be controlled to emit light at respective portions of the time period if they emit light at the same frequency or bandwidth, and where the phototransmitter can be controlled to emit light at the same time during the time period if they emit light at different frequencies or at different bandwidth). If the measured signals indicate no saturation, these signals are used in subsequent calculations corresponding to that time period. If the measured signals corresponding to the high setting are saturated, then additional measurements in a subsequent time period are taken at the medium power setting. If the measured signals corresponding to the medium setting indicate no saturation, then these signals are used in subsequent calculations. If the measured signals corresponding to the medium setting indicate that the photoreceiver is saturated, then additional measurements are taken at the low power setting in a subsequent time period and these are used in subsequent calculations. The low power setting is set up to produce measured signals just below saturation when the photoreceiver is completely covered by an object at the surface of the sensing assembly. This procedure can be repeated for each of the time periods needed to detect a gesture.

As noted, the measured digital signals are a measure of the intensity of the reflected infrared light. The power levels can be chosen to provide some overlap between levels such that the measured signals from different power levels can be converted to a standard scale such that they can be combined together into a continuous curve. For example, data can be taken for the overlap regions (such as corresponding to several push or pull gestures) and a curve fit performed. In one example, the following equations are obtained for converting measurements obtained at the various power levels to a standard intensity scale denoted by I:

$$I = I_{PowerLevel=high}$$

$$I = 12 * I_{PowerLevel=medium} + 38$$

$$I = 128 * I_{PowerLevel=low} + 3911$$

In the above manner, measured signal sets can be obtained which provide intensity values over time corresponding to the different phototransmitters emitting light in different directions or corresponding to the different photoreceivers receiving light from different directions. Each digital measured signal set can provide relevant information regarding the presence or absence of an object in a respective volume corresponding to a respective phototransmitter or photoreceiver and relative to the sensing assembly.

At a step 1806, one or more of the measured signal sets are evaluated to detect the predefined gesture and to determined corresponding locations of the object at various times during the gesture. For example, as further described below, a specific feature of a measured signal set can be sought and the timing of this feature can be compared with the timing of a corresponding feature in one or more of the other measured signal sets to detect the gesture. Furthermore, as also described below, one or more of the measured signal sets, or portions thereof, can be combined in a specified manner and evaluated so as to extract relevant information regarding the occurrence of a gesture.

At a step 1807, a determination is made as to whether the gesture has been detected. If so, processing proceeds to a step 1808, and if not, processing proceeds to a step 1809. At step 1809, a request is generated for a user to repeat the gesture, and processing then proceeds to step 1802.

At the step 1808, the operation of the electronic device is controlled in response to the detected gesture, such as by controlling a specific function of the electronic device or controlling the selection of content stored on the electronic device. The various predefined gestures can each be associated with any one of a variety of electronic device operations, although preferably, the predefined gestures each control an operation or action of the electronic device in an intuitive manner. For example, the detection of a push gesture can be used to decrease or limit a function, such as to turn down the volume for a music player, or perform a zoom operation for a camera feature of the electronic device, wherein the distance of the object from the electronic device at a specified time can be correlated to the amount that the volume or zoom operation will be changed. Similarly, a pull gesture can be used to correspondingly increase a function. Push and pull gestures can also be used to navigate through stacked menus, pictures, or other items for selection.

As another example, a slide gesture over the display screen from top to bottom can denote an erasure or closing of an application, while a slide gesture from side to side of the display screen may indicate a scroll function, or the like, wherein a relative xy location of the object during the slide gesture is linked to the position of a cursor on a display screen of the electronic device. A hover gesture, especially in conjunction with other gestures for locating an item can mean a selection of an item after it has been located, such as the selection of a specific file, image, song, or other item. A tilt gesture about a y axis for example, can denote the page turning of an e-book or photo album.

Advantageously, a specific gesture (including a specific combination gesture) can be used to easily and quickly select one or more items displayed on the display screen of the electronic device in a touchless manner. Because predefined gestures are detectable in a three dimensional space, this allows for various menus or displays of items such as contacts or pictures to be arranged in a quasi three dimensional manner on a display screen of the electronic device. Specific items are selectable through the use of one or more predefined gestures (including push/pull, slide, tilt, and hover gestures) for controlling the movement of a corresponding cursor or other selection device through the three dimensional arrangement of items. For example, if several groups of two or more stacked windows (or photos or documents or other items) are shown on the display screen of the electronic device, a user can perform one or more slide gestures to select a desired group, followed by a push gesture to maneuver within the stack. Alternately, a user can perform a slide gesture to push one or more top windows out of the way, or a user can reach a hand toward the screen with a push gesture followed by a tilt gesture to dive past one or more top windows and slide a lower window out to the side for better visibility.

Figure 19:
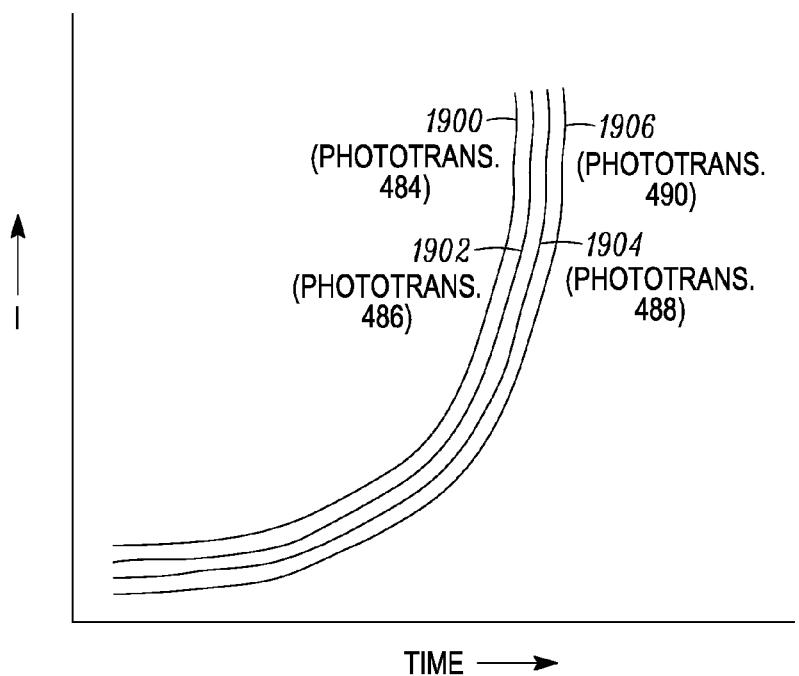
FIG. 19 is an exemplary graph of intensities versus time for a push gesture.

As mentioned above, various gesture detection routines including various processing steps can be performed to evaluate the measured signals. For example, assuming the use of a sensing assembly 400 as shown in FIG. 4, FIG. 19 shows an exemplary graph of intensities versus time curves 1900, 1902, 1904, and 1906 which represent digital measured signal sets corresponding to respective phototransmitters 484, 486, 488, and 490 for a push gesture. Basically, as an object moves closer to the sensing assembly 400, the corresponding intensity values in each set increase during the same time frame (which includes a plurality of sequential time periods), and if the object is generally centered above the sensing assembly as the gesture is performed, the amount that each set of values is increased over that time frame is generally the same, as shown in FIG. 19.

Figure 20:
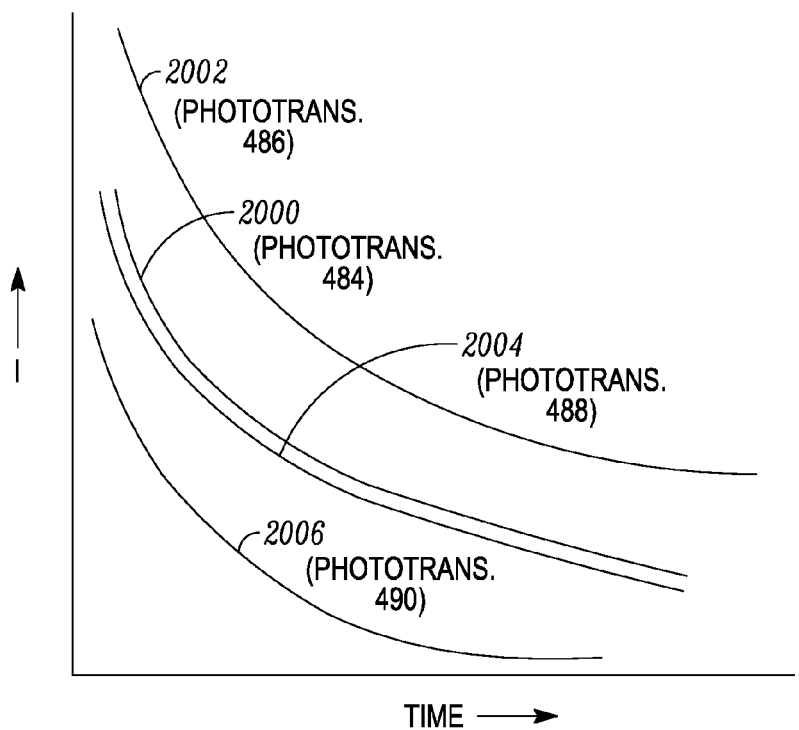
FIG. 20 is an exemplary graph of intensity versus time for a pull gesture.

In cases where the object is offset somewhat from the sensing assembly, minimum intensity values and maximum intensity values (corresponding respectively to when the object is at a far distance and when the object is at a near distance) of the measured signal sets would still occur at roughly the same respective times, but would have different values (amplitudes) at the same respective times as between the different sets. For example, FIG. 20 is an exemplary graph of intensities versus time curves 2000, 2002, 2004, and 2006 which represent digital measured signal sets corresponding to the respective phototransmitters 484, 486, 488, and 490 for a pull gesture, and illustrates that as an object moves farther away from the sensing assembly, the corresponding intensity values of the measured signals sets all decrease during the same time frame. If the object is generally centered above the sensing assembly as the gesture is performed, the amount that each set of values is decreased over the time frame is generally the same amount. However, as shown in FIG. 20 in a case where an object is offset somewhat from the sensing assembly such as by being generally centered to the right side of the sensing assembly 400, then maximum and minimum intensity values corresponding to each of the measured signal sets would still occur at roughly the same respective times, but would have differing values. In this case, if the object is generally centered to the right side of the sensing assembly 400, then the measured signal set corresponding to the phototransmitter on the right side, namely phototransmitter 486, will have the largest values, measured signal sets corresponding to phototransmitters 484 and 488 will generally track together, and the measured signal set corresponding to phototransmitter 490, which is farthest away from the object and directs light away from the object, will have the smaller values as compared to the other. Note that intensity is related to distance in an inverse, non-linear manner, and assuming that a push or pull gesture is performed at an approximately constant speed, the intensity values will increase or decrease in a non-linear manner.

Therefore, a gesture detection routine for detecting a push (or pull) gesture can include steps to evaluate one or more of the measured signal sets to determine whether corresponding intensity values are increasing (or decreasing) over time, and can include steps to compare amplitudes of these sets with respect to each other at one or more times. The number of different measured signal sets to be evaluated can be based on whether other gestures need to be detected and distinguished and which other gestures these may be. For example, if just a push gesture is to be detected, then evaluation of a single measured signal set can be sufficient to determine if intensity values are sequentially increasing, while if it is desired to distinguish between a generally centered push gesture and an offset push gesture, then two or more of the measured signal sets would need to be included in the analysis.

Processing steps can be performed on the digital measured signal sets to convert intensity values to corresponding distances. In particular, the processor can be programmed to perform a Z distance determination routine using the measured digital signals to determine an object's relative distance above the central surface (or other reference surface on the electronic device) at one or more different times during a push or pull gesture. Because the intensity of the measured reflected light (i.e., the measured signal) is dependent upon the size, color, and surface texture/reflectivity of the object, an exact value for distance can not be determined based solely on the received intensity, but the electronic device can be calibrated so as to provide an approximate distance based on the use of a specific object, such as an open medium-sized hand. Alternately, the user may perform a calibration routine to personalize for the user's individual left or right hand.

Specifically, the reflected light intensity varies as a function of $1/distance^2$. A resulting distance or Z value corresponding to each of the phototransmitters can then be calculated and scaled to be within a certain range based on a measured intensity value. For example, assuming four phototransmitters, distance values $Z_1$, $Z_2$, $Z_3$ and $Z_4$ corresponding to a respective phototransmitter can be calculated as a 10 bit value within a predetermined range, such as a value between 0 and 1000 (with any results greater than 1000 being set to 1000) using the following equation using a measured intensity I:

$$Z=10000/sqrt(I)$$

In some cases, an average Z value representing distance can then be calculated by averaging together the Z values calculated corresponding to the multiple phototransmitters, such as:

$$Z_{avg}=(Z_1+Z_2+Z_3+Z_4)/4$$

In some cases, distances can be calculated using corresponding measured signals from a subset of all the phototransmitters (or photoreceivers).

In one embodiment, the processor can be programmed to calculate corresponding distances for each of the sequential time periods of a push or pull gesture. For a push gesture, these distances are sequentially decreasing over time (in a generally linear manner assuming a constant speed of the push gesture), and for a pull gesture, these distances are sequentially increasing over time. In this manner, it is possible to associate a corresponding calculated distance with the position of a cursor such as to locate a particular item in a stack of items on a display screen of the electronic device, or to associate a corresponding calculated distance with a particular change in or amount of change of a control setting, such as for a volume or zoom control function.

Figure 21:
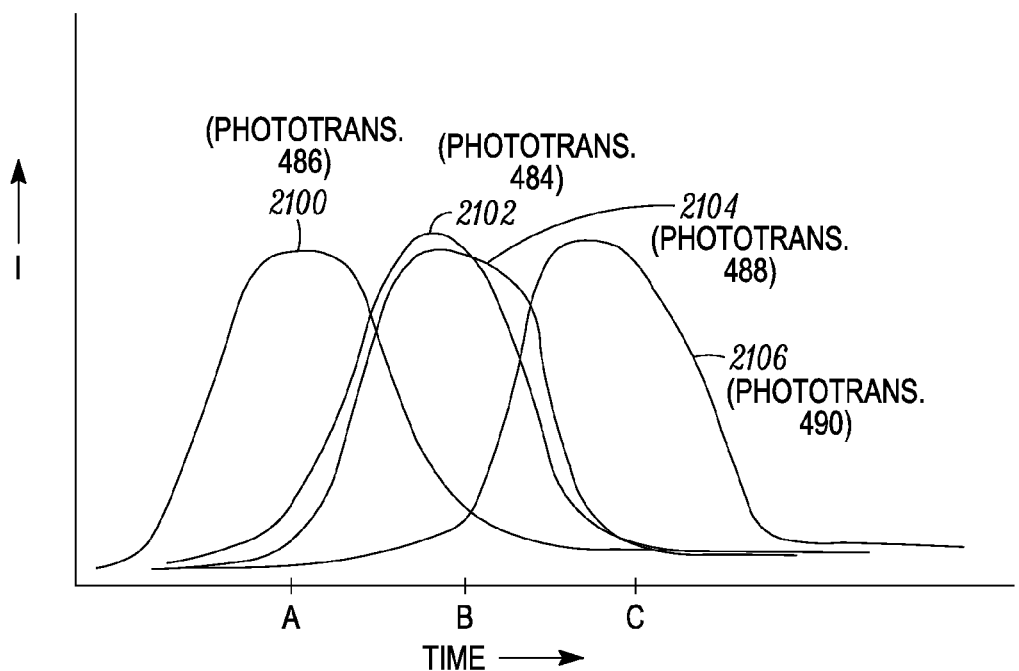
FIG. 21 is an exemplary graph of intensities versus time for a slide gesture in the negative x direction.

With respect to a slide gesture, assuming that a z-axis distance of the object from the sensing assembly remains relatively constant, then the occurrence of a slide gesture and its direction can be determined by examining the timing of the occurrence of intensity peaks in corresponding measured signal sets with respect to one or more of the other measured signal sets. As an object gets closer to a specific phototransmitter's central axis of transmission, the more light from that transmitter will be reflected and received by a photoreceiver, such as the photoreceiver 492 of sensing assembly 400 shown in FIG. 4. The timing of the intensity peaks in each measured signal set with respect to the other measured signal sets provides information regarding the direction of travel of the object. For example, FIG. 21 is an exemplary graph of intensity versus time curves 2100, 2102, 2104, and 2106, which represent measured signal sets corresponding to respective phototransmitters 486, 484, 488, and 490 for a slide gesture performed by an object such as a hand that moves above sensing assembly 400 of FIG. 4, and specifically illustrates a slide gesture of an object moving from the right side to the left side across the electronic device. Thus, the object is first closest to phototransmitter 486, then moves across phototransmitters 484 and 488 at roughly the same time, and is then closest to phototransmitter 490.

Figure 22:
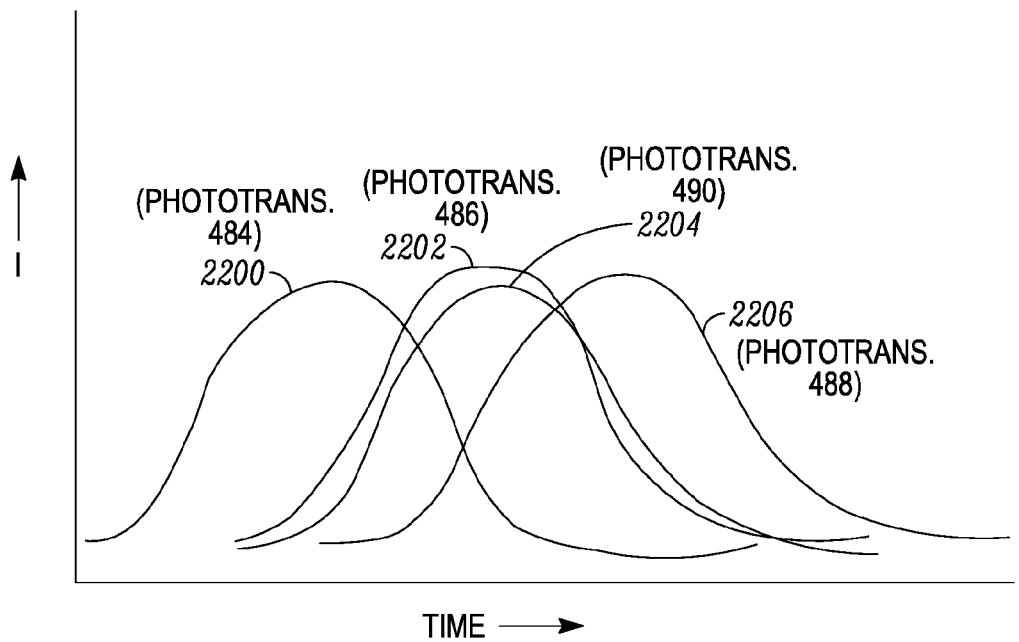
FIG. 22 is an exemplary graph of intensities versus time for a slide gesture in the negative y direction.

Similarly, FIG. 22 is an exemplary graph of intensities versus time curves 2200, 2202, 2204, and 2206 for a slide gesture by an object moving from top to bottom across the sensing assembly 400 (denoted here as a vertical gesture), wherein the curves 2200, 2202, 2204, and 2206 represent measured signal sets corresponding to respective phototransmitters 484, 486, 490, and 488. In this case, the object moves top to bottom across phototransmitter 484 first, then across phototransmitters 486 and 490 at roughly the same time, and then across phototransmitter 488, with the movement generally centered with respect to the phototransmitters 486 and 490. As shown in FIG. 22, an intensity peak in the measured signal set corresponding to the phototransmitter 484 occurs prior to intensity peaks in the measured signal sets corresponding to phototransmitters 486 and 490, and the intensity peaks in the measured signal sets corresponding to phototransmitters 486 and 490 occur prior to an intensity peak in the measured signal set corresponding to the phototransmitter 488. Although not shown, in a case in which a top to bottom slide gesture is performed but where the object is slightly offset from being centered between phototransmitters 486 and 490 such as by being closer to phototransmitter 486, then the graph shown in FIG. 22 would be modified in that the peaks corresponding to curves 2200 (phototransmitter 484), 2204 (phototransmitter 490), and 2206 (phototransmitter 488) would be smaller, and the peak corresponding to curve 2202 (phototransmitter 486) would be bigger.

Figure 23:
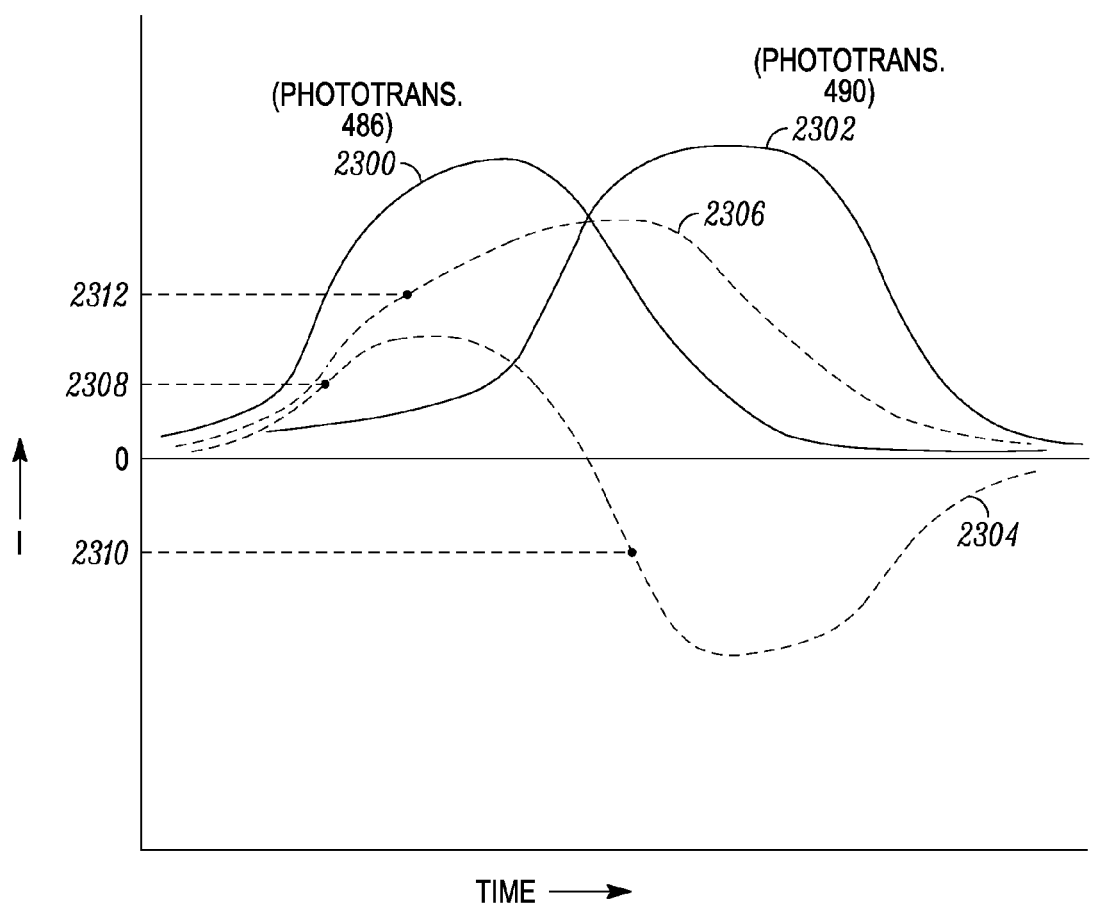
FIG. 23 is a graph illustrating a horizontal swipe recognition analysis.

FIG. 23 is a graph illustrating an analysis for recognizing a side to side slide gesture (also denoted here as a horizontal slide gesture) of an object from a right side to a left side of an electronic device using sensing assembly 400. In particular, FIG. 23 illustrates a first intensity curve 2300 representing a measured signal set corresponding to the phototransmitter 486, a second intensity curve 2302 representing a measured signal set corresponding to the phototransmitter 490, a calculated third curve 2304 which represents difference intensity values, e.g., intensity values corresponding to the right phototransmitter 486 minus intensity values corresponding to the left phototransmitter 490 at respective time periods, and a calculated fourth curve 2306 which represents average intensity values, e.g., intensity values corresponding to an average of intensity values corresponding to the phototransmitter 486 and the phototransmitter 490 at respective time periods.

If the object moves from the right to the left during the slide gesture, then the calculated difference values will first be positive and then will be negative, as shown by curve 2304. If an object moves from the left to the right during the slide gesture, then the calculated difference values will first be negative and then will be positive. Thus computation and analysis of difference values can provide information regarding the presence and direction of a slide gesture. In some cases, a gesture detection routine can calculate a first difference curve representing intensity values corresponding to the right phototransmitter 486 minus intensity values corresponding to the left phototransmitter 490, and can also calculate a second difference curve representing intensity values corresponding to the left phototransmitter 490 minus intensity values corresponding to the right phototransmitter 486. A positive signal followed by a negative signal in the first difference curve determines that a slide gesture occurred from right to left, and a positive signal followed by a negative signal in the second difference curve determines that a slide gesture occurred from left to right.

The magnitude of the difference signal is dependent on how close the object is to the sensing assembly when the gesture occurs. In one embodiment, a corresponding detect threshold 2308 is selected and used to determine if the difference signal has gone positive an appropriate amount, and a recognize threshold 2310 is selected and used to determine that the gesture has occurred when the signal goes negative an appropriate amount. These thresholds can provide additional assurance that a slide gesture has indeed occurred.

Additionally, a slide gesture detection routine can also utilize the average intensity values (denoted by curve 2306) of the measured signal sets corresponding to the outlying phototransmitters 486 and 490 and set a clearing threshold 2312 such as shown on curve 2306 with respect to these average intensity values. If the calculated average intensity signal falls below this clearing threshold prior to when recognition of the gesture has occurred, then the routine is reset and the start of a new gesture is sought.

The slide gesture detection routine can also determine approximate xy locations of the object at different times. For example, referring to FIG. 21, at a time A, the object performing the gesture is generally above phototransmitter 486, at a time B, the object is generally above phototransmitters 484 and 488, and at a time C, the object is generally above phototransmitter 490. Various other locations can also be determined using interpolation.

A gesture detection routine similar to that described above with respect to FIG. 23 can be employed to detect a top to bottom gesture instead of a side to side gesture. Further, a similar analysis can apply to the determination of a slide gesture in another direction, such as one generally along an x=y line.

The electronic device can be operated such that gesture detection routines for detection of both vertical (top to bottom or bottom to top) slide gestures and horizontal (side to side) slide gestures operate simultaneously. In such a case, the predetermined detect and recognize thresholds corresponding to each type of slide gesture can be increased over that when a single gesture detection routine is operating.

More complex routines can also be employed in order to distinguish between slide gestures in the different directions, e.g., to distinguish between vertical (top to bottom or bottom to top) slide gestures and horizontal (right to left or left to right) slide gestures. These can be helpful especially when a slide is performed in one direction, but conflicting signals are also produced that tend to indicate that a slide in another direction has also been performed. For example, this can occur when a hand or thumb is the object and parts of the wrist or hand extend into the active sensing volume and affect the measured signal sets. In order to better distinguish between horizontal and vertical slides, it is recognized that a slope of a difference intensity values set over time corresponding to an intended slide direction at a zero crossing point is greater than a slope of a difference intensity values set corresponding to an unintended slide direction.

Figure 24:
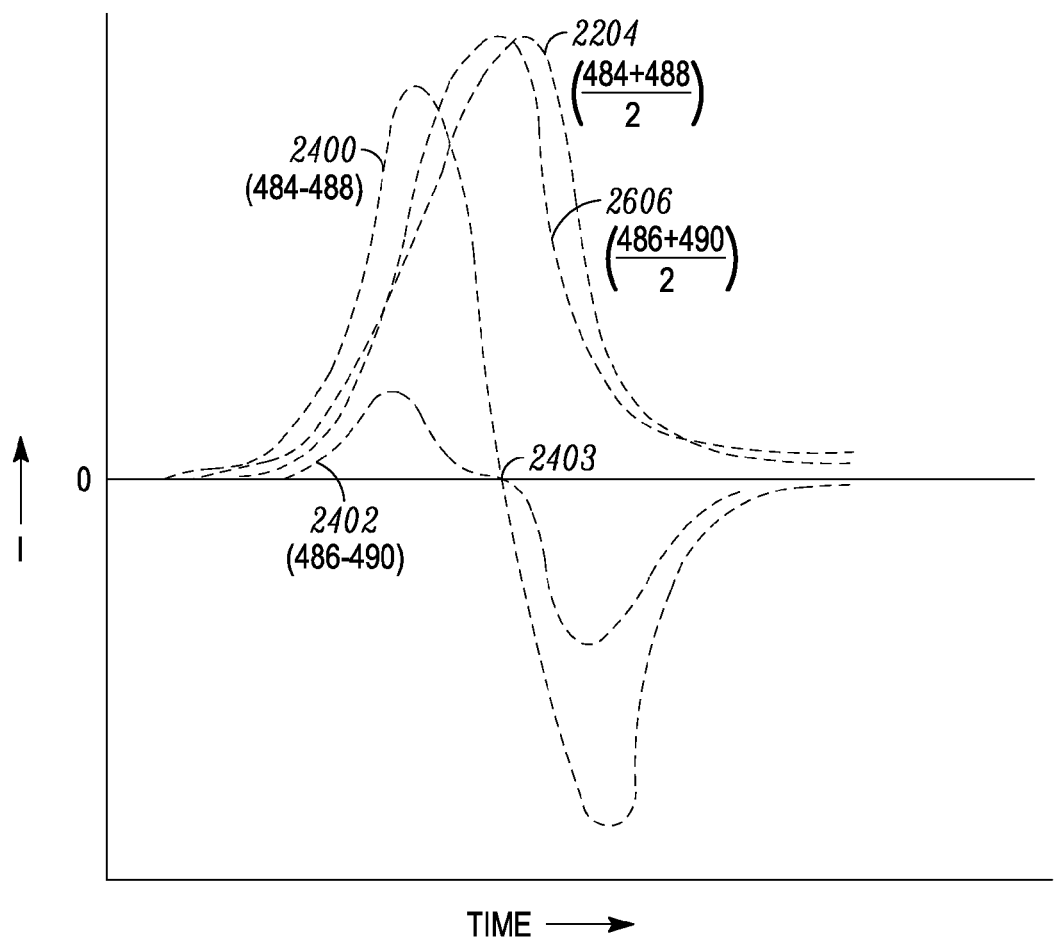
FIG. 24 is a graph illustrating an analysis for distinguishing between a horizontal swipe and a vertical swipe.

Specifically, referring to FIG. 24, first vertical difference intensity values shown as curve 2400 are calculated with respect to the vertically aligned phototransmitters (e.g. phototransmitters 484 and 488) and second horizontal difference intensity values shown as curve 2402 are calculated with respect to the horizontally aligned phototransmitters (e.g., phototransmitters 486 and 490). A first slope of the first difference intensity values set is calculated at a zero crossing point 2403, and a second slope of the second difference intensity set is also calculated. Calculation of the first slope can be achieved by taking three values behind the zero crossing point and one value in front, and calculating a difference between a maximum and a minimum of these values. In a similar fashion, a second slope corresponding to the second difference intensity values can also be determined. If the first slope is greater than the second slope such as is the case in FIG. 24, then a vertical slide gesture is determined to have occurred, while if the second slope is greater than the first slope, then a horizontal slide gesture is determined to have occurred.

Various other ways to determine whether an intended gesture has occurred in a horizontal or vertical direction can also be employed, including calculating both vertical and horizontal average intensity signal sets, denoted by respective curves 2404 and 2406, and determining whether a largest average value corresponds to either the vertical or horizontal signal set, with the largest average value indicating that the intended gesture has occurred in the corresponding vertical or horizontal direction. Another method involves determining a largest intensity value corresponding to one of the phototransmitters at a detection threshold, from which a starting point of a gesture can be inferred. Still another method examines the magnitude of a difference between a positive peak and a negative peak as between horizontal and vertical average signals.

Figure 25:
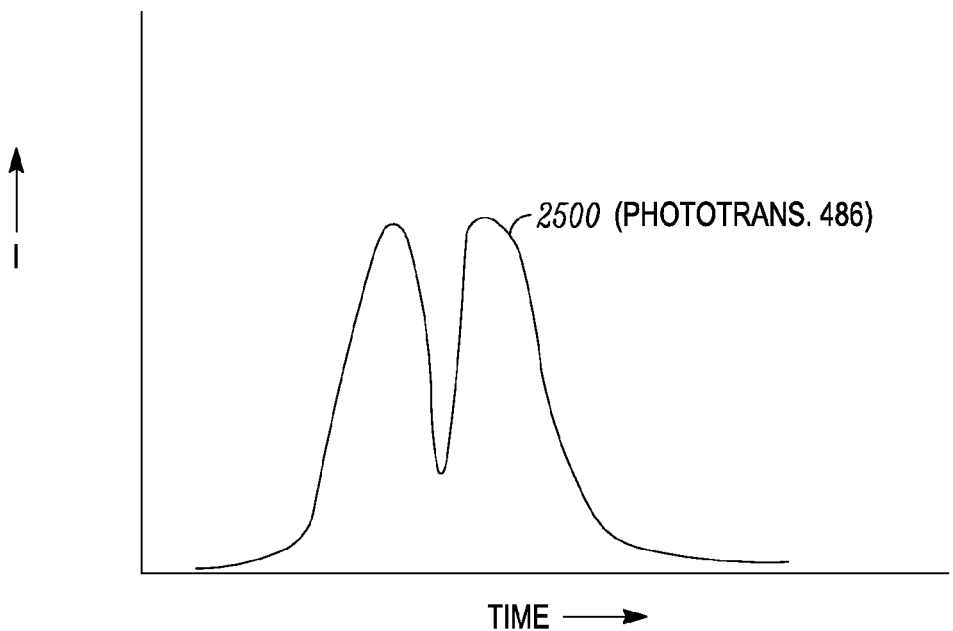
FIG. 25 is an exemplary graph of intensities versus time for a slide gesture in the positive x direction and performed with a hand in a peace sign configuration.

FIG. 25 is an exemplary graph of a curve 2500 representing a measured signal set corresponding to a phototransmitter such as phototransmitter 486 of sensing assembly 400, wherein a horizontal slide gesture is performed by a hand in a peace sign configuration (with fingers pointing in a general y direction). In this case, the hand configuration can be detected by determining the presence of two adjoining peaks in one or more measured signal sets. As described previously, the timing of these two adjoining peaks as compared to timing of corresponding peaks of one or more of the other different phototransmitters (such as phototransmitter 490) provides information regarding the direction of the slide gesture.

Figure 26:
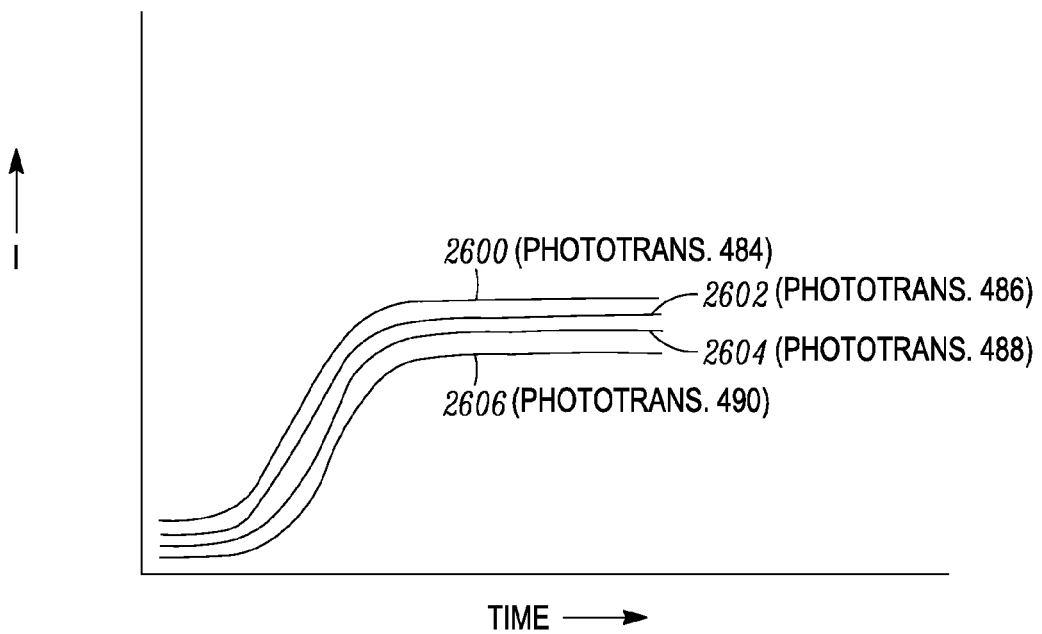
FIG. 26 is an exemplary graph of intensities versus time for a hover that occurs after a push gesture.

FIG. 26 is an exemplary graph of curves 2600, 2602, 2604, and 2606 which represent measured signal sets corresponding to phototransmitters 484, 486, 488, and 490 for a hover gesture which is a pause in movement for a predetermined time period, and which is performed for example as an object such as an open hand moves from a position generally centered above the sensing assembly 400 to a position closer to the sensing assembly and then stays there for a predefined period of time. As shown, curves 2500, 2502, 2504, and 2506 indicate a hover gesture by a corresponding leveling out, where the intensity remains unchanged for the predetermined amount of time, such as several seconds, for each of the measured signal sets. A corresponding distance of the hover gesture from the sensing'assembly can be determined as described above.

Figure 27:
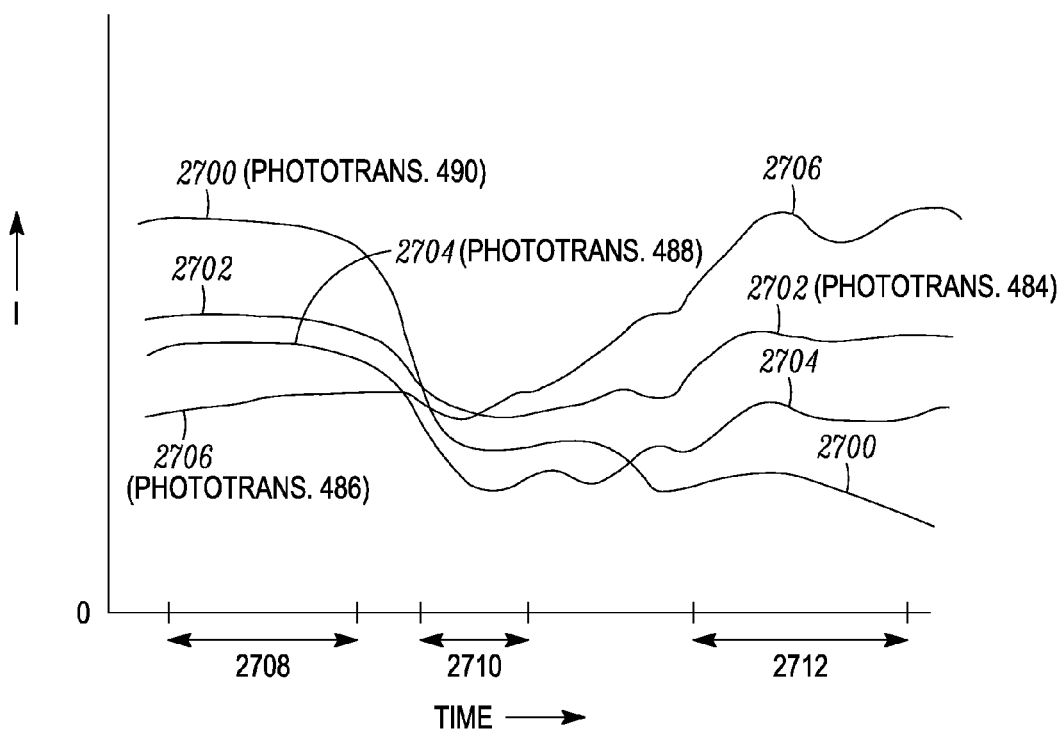
FIG. 27 is an exemplary graph of intensities versus time for a tilt gesture.
Figure 28:
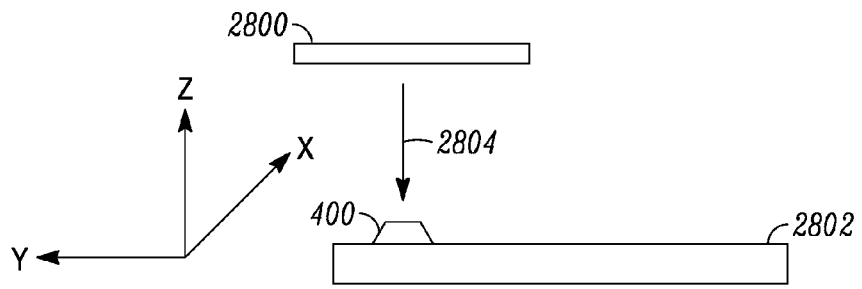
FIGS. 28-31 illustrate consecutive gestures including a push gesture, a tilt gesture, and a slide gesture.
Figure 29:
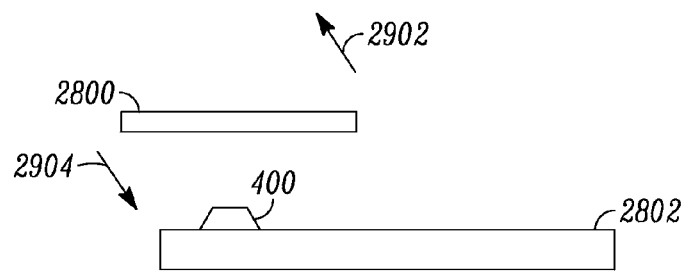
Figure 30:
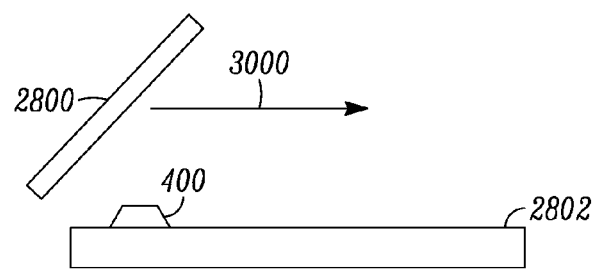

FIG. 27 is an exemplary graph of curves 2700, 2702, 2704, and 2706 which represent measured signal sets corresponding to respective phototransmitters 490, 484, 488, and 486 for a tilt gesture. In this case the tilt gesture is a rotation of an object (such as a open hand situated above the sensing assembly and aligned with fingers pointing in a+y direction) about an axis generally parallel to the y-axis, beginning from a tilted left orientation, rotating through an orientation of the hand generally perpendicular to the mobile device, and then rotating to a tilted right orientation. As shown, an intensity peak corresponding to phototransmitter 490 has a maximum magnitude which is greater than the others during the tilted left orientation (time frame 2708), and the intensity peak corresponding to phototransmitter 486 has a magnitude which is less than the others during the tilted left orientation (time frame 2708). As the hand is moved to an orientation generally perpendicular to the mobile device, all of the phototransmitters have generally similar intensity values (time frame 2710). During the tilted right orientation (time frame 2712), an intensity peak corresponding to the phototransmitter 486 is greater than the others, and an intensity peak corresponding to phototransmitter 490 is less than the others. By recognizing such patterns in the measured signal sets, a tilt gesture can be detected. Further, approximate orientations of the hand can be determined at various times during the gesture.

With respect to other predefined gestures, or other hand configurations, these other gestures can be detected by using similar techniques to those described above, namely by detecting certain patterns or features which have been identified with respect to corresponding measured signal sets, such as the timing of intensity peaks in one set with respect to intensity peaks in one or more of the other sets.

The use of two or more consecutive gestures and detection thereof can provide additional control possibilities for the electronic device. Many different consecutive gesture sets are possible, which can include the same or different gestures, and many different operations can be associated with these different sets. In general, detection of consecutive gestures employs the same or similar techniques to those discussed above. Note that consecutive gestures are not equivalent to a combination gesture. A combination gesture will not have all signal sets measured as near-zero at any time during the gesture. If all signal sets are measured as near-zero, this indicates that no gesture is currently occurring, and thus this lull separates consecutive gestures.

A series of gestures can be advantageous in order to provide multiple step control of an electronic device. For example, the electronic device can be operable such that one or more first gestures can be performed to locate an item, and a second gesture can be performed to select or launch the item. Specifically, one or more consecutive slide gestures can enable a user to scroll within a document or between a plurality of files when only a portion of the document or files can be displayed on a display screen at once. When the user locates a particular desired portion of the document or a desired file, a hover gesture can be performed in order to select or launch that corresponding portion or file.

Figure 31:
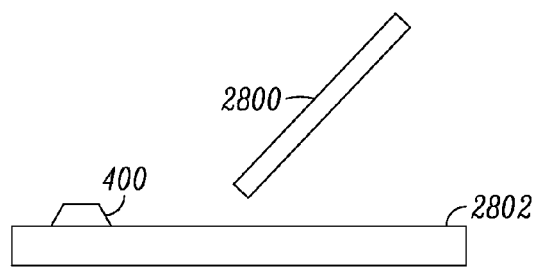

Another example of a series of consecutive gestures is illustrated in FIGS. 28-31. In particular, these show an object 2800 which moves relative to an electronic device, such as a mobile device 2802. Mobile device 2802 includes a sensing assembly such as sensing assembly 400 of FIG. 4. As illustrated, a push gesture can first be performed, as indicated by arrow 2804 in FIG. 28, followed by a tilt gesture such as a rotation of the object 2800 about an axis parallel to the x-axis, as indicated by arrows 2902, 2904 in FIG. 29. Subsequently, a slide gesture can be performed, as indicated by arrow 3000 in FIG. 30, with the resultant position and orientation of the object 2800 as shown in FIG. 31. Assuming that the position of the object 2800 is initially linked to control a position of a cursor on a display screen of the mobile device 2802, this series of gestures can be used for example to first identify a specific item in a stack of items using the push gesture, then select the identified item using the tilt gesture, and slide the selected item to a different area on the display screen using the slide gesture. If these consecutive gestures were performed one after another without any removal of the object 2800 between each basic gesture, then they would become a single combination gesture.

In certain cases, it is advantageous for an electronic device to be controlled using an offset interpretation routine to interpret gestures which are performed when an object is offset from a generally centered position with respect to a sensing assembly. As previously mentioned, gestures performed in an offset manner, such as to the side of a sensing assembly, can be advantageous in that a display screen of an electronic device can remain unobstructed and the offset gestures can control corresponding movements of an indicator on the display screen.

Figure 32:
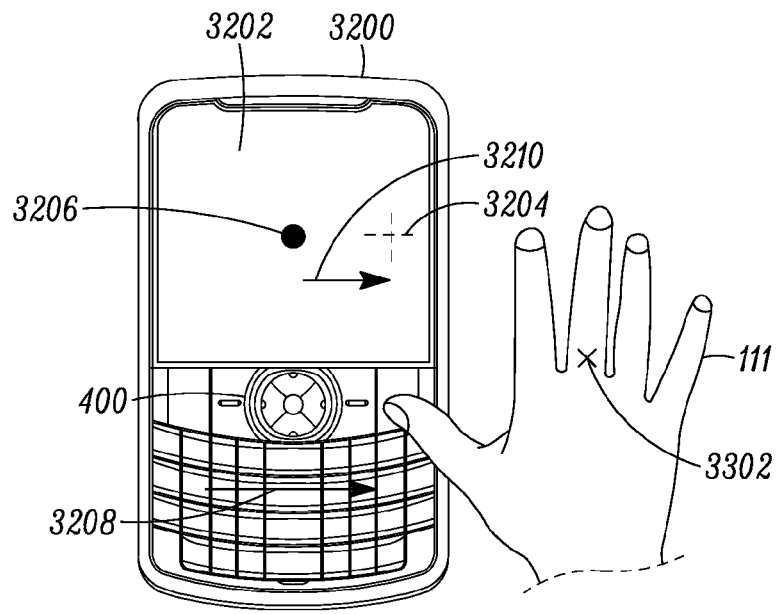
FIGS. 32-33 illustrate an electronic device which can be controlled using offset gestures.
Figure 33:
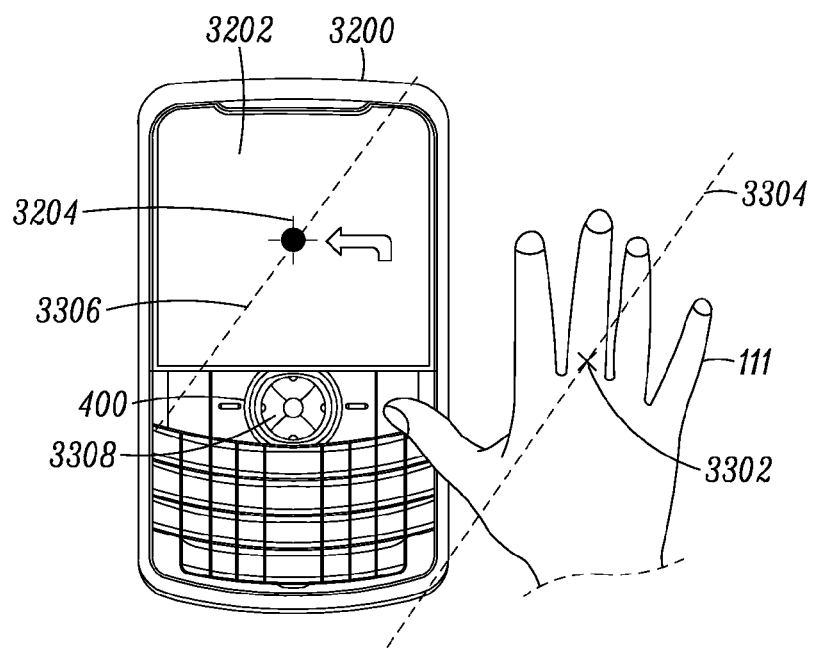

FIGS. 32-33 help illustrate a manner of control of an electronic device 3200 using offset gestures. As shown, electronic device 3200 can include a display screen 3202 and a sensing assembly 400. Initially, the electronic device runs a gesture detection routine such as described above so that a location of an object such as a hand 111 at a point in time controls a corresponding location of an indicator 3204 (such as a cursor) on the display screen 3202. When the hand 111 is stationary and generally centered above the sensing assembly 400, the indicator 3204 is oriented at a corresponding predetermined reference location 3206, and movement of the hand 111 with respect to a generally centered location above the sensing assembly 400 then controls the corresponding movement of the indicator 3204 on the display screen with respect to the reference location 3206. A first specified pattern of movement can be defined which, when performed and detected, triggers an offset gesture interpretation routine to be run. When the electronic device runs the offset gesture interpretation routine, a centering operation is performed to recenter the indicator 3204 on the display screen in accordance with a detected reference offset location, as described below, and such that movement of the hand 111 to a new location with respect to the detected reference location will then control the corresponding movement of the indicator 3204 on the display screen to a corresponding new location with respect to the reference location 3206.

For example, the first specified pattern of movement can be a combination gesture including a slide gesture followed by a hover gesture. Assuming the electronic device is running the gesture detection routine, as the hand 111 is moved to perform a slide gesture, as indicated by arrow 3208 in FIG. 32, then the indicator 3204 is controlled to move along with it, as indicated by arrow 3210. When the hand 111 reaches a desired reference offset location, such as denoted by 3302, a hover gesture can be performed for a predetermined time duration (such as 1 or 2 seconds). The electronic device 3200 operates to identify the hover gesture and detect the corresponding location 3302 of the hand 111 during the hover gesture. In response to the identification of the hover gesture following an identified slide gesture, the indicator 3204 is recentered to the reference location 3206. The reference location 3206 on the display screen now is linked to the detected reference offset location 3302 of the hover gesture, such that additional movement of the hand from the location 3302 can control corresponding movement of the indicator 3204 from the reference point 3206. For example, an offset slide gesture in a direction along axis 3304 in an xy plane will then control corresponding movement of the indicator 3204 along a parallel axis 3306 on the display screen 3202. In this manner, by, determining corresponding locations of the object at different times during the offset gesture, corresponding sequential locations of the indicator 3204 on the display screen can be controlled.

The reference offset location 3302 of the object may also include an orientation, or tilt component. Thus, not only are relative location changes (relative to the reference offset location in three-dimensional space) tracked, but relative orientation changes (relative to the reference offset location in orientation about a roll, pitch, or yaw axis) may also be tracked. Thus, if a person is more comfortable holding an object (such as the user's hand) at an angle when using offset gestures, the angle can be incorporated into the reference offset location 3302. Further tilting acts as a tilt gesture while remaining at the tilt measured during the recentering procedure is treated as "flat". In other words, the location and orientation of the external object at the time of the recentering measurement is the new reference location and orientation [x=0,y=0,z=0,tilt=0] used for future object tracking and gesture detection.

A sensing assembly having four or more corresponding phototransmitters or photoreceivers (such as sensing assembly 400) could be utilized to detect offset gestures. In the illustrated example of FIGS. 32 and 33, where the offset gestures are performed off to the right side of the sensing assembly 400, even though a measured signal set corresponding to the leftmost phototransmitter 3308 would provide little to no information relating to the location or orientation of the hand 111 (because it would likely not receive emitted light that is reflected by the hand), the three other phototransmitters correspond to generated measured signal sets which provide information sufficient to detect movement and determine corresponding locations of the object over time during an offset gesture.

The sensing assembly 400 and processor can also detect a corresponding orientation of an object at various times as an offset gesture is performed. For example, the indicator 3204 can be an item such as an airplane in a video game, and the orientation of the airplane on the display screen can be controlled using various tilt gestures performed in an offset manner, which can be performed and detected in a manner similar to that described above with respect to FIG. 27. Thus, the offset gestures can operate to control the locations of and orientations of an indicator on a display screen over time.

By supporting a recentering operation, a user can perform offset gestures to control operation of an electronic device without blocking the user's view of a display screen of the electronic device. Thus, gestures can be detected with respect to a reference location (and optionally, a reference orientation) that is not centered about the sensing assembly. In some implementations, the offset gestures are performed in a three-dimensional space that is outside of the volume normal to particular portion of a display screen. In this implementation, the user's view of the display is unlikely to be blocked by the gesturing object.

It is specifically intended that the present invention not be limited to the embodiments and illustrations contained herein, but include modified forms of those embodiments including portions of the embodiments and combinations of elements of different embodiments as come within the scope of the following claims.

We claim:

1. A method for controlling an electronic device, the method comprising:
   providing as part of the electronic device a display screen for displaying content and a sensing assembly including at least one photoreceiver and a plurality of phototransmitters, wherein each phototransmitter is positioned to emit infrared light away from the electronic device about a corresponding central transmission axis, wherein each central transmission axis is oriented in a different direction with respect to the others;
   controlling emission of infrared light by each of the phototransmitters during each of a plurality of time periods as an external object moves in a first specified pattern of movement which is offset from a generally centered position with respect to the sensing assembly;
   for each of the phototransmitters and for each of the plurality of time periods, generating a corresponding measured signal indicative of a respective amount of infrared light which originated from that phototransmitter during that time period and was reflected by the external object prior to being received by a photoreceiver;
   evaluating the measured signals to identify the first specified pattern of movement of the object, and to detect a reference offset location corresponding to an end of the first specified pattern of movement of the object;
   performing a centering operation in response to the identification of the first specified pattern of movement, wherein the centering operation moves an indicator to a predetermined reference location on the display screen, wherein the predetermined reference location is then associated with the reference offset location; and
   subsequently controlling sequential locations of the indicator on the display screen in accordance with further determined locations of the object relative to the reference offset location.

2. The method of claim 1, wherein the subsequently controlling comprises:
   evaluating the measured signals to determine, for each of a group of time periods, a corresponding location of the object with respect to the sensing assembly; and
   controlling sequential locations of the indicator on the display screen in accordance with the corresponding determined locations.

3. The method of claim 1, wherein the evaluating further comprises:
   evaluating the measured signals to detect a reference orientation of the object at the end of the first specified pattern of movement.

4. The method of claim 3, wherein the subsequently controlling further comprises:
   determining subsequent orientations of the object relative to the reference orientation.

5. The method of claim 4 wherein the subsequently controlling further comprises:
   controlling orientations of the indicator on the display screen in accordance with the subsequent orientations of the object relative to the reference orientation.

6. The method of claim 1, wherein the first specified pattern of movement includes a slide gesture followed by a hover gesture.

7. The method of claim 6, wherein the reference offset location is a location corresponding to the object during the hover gesture.

8. The method of claim 6, wherein a reference orientation is an orientation corresponding to the object during the hover gesture.

9. The method of claim 1, wherein the subsequently controlling comprises:
   detecting movement of the object in a second pattern of movement in an offset volume, wherein the second pattern of movement includes at least one of a push/pull gesture, a slide gesture, and a tilt gesture.

10. The method of claim 9 wherein the offset volume does not include a three-dimensional volume defined by an area within the display screen and extending in a normal vector away from the display screen.

11. A method for controlling an electronic device, the method comprising:
    providing as part of the electronic device a display screen for displaying content and a sensing assembly including at least one phototransmitter and a plurality of photoreceivers, wherein the phototransmitter is positioned to emit infrared light away from the electronic device about a central transmission axis, and each photoreceiver is positioned to receive infrared light about a corresponding central receiving axis, wherein each central receiving axis is oriented in a different direction with respect to the others;
    controlling emission of infrared light by the phototransmitter during each of a plurality of time periods as an external object moves in a first specified pattern of movement wherein an end of the first specified pattern of movement is offset from a generally centered position with respect to the sensing assembly;
    for each of the plurality of photoreceivers and for each of the plurality of time periods, generating a corresponding measured signal indicative of a respective amount of infrared light which originated from the phototransmitter during the corresponding time period and was reflected by the external object prior to being received by the corresponding photoreceiver;
    evaluating the measured signals to identify the first specified pattern of movement of the object, and to detect a reference offset location corresponding to the end of the first specified pattern of movement;
    performing a centering operation in response to the identification of the first specified pattern of movement, wherein the centering operation moves an indicator to a predetermined reference location on the display screen, wherein the predetermined reference location is then associated with the reference offset location; and
    subsequently controlling sequential locations of the indicator on the display screen in accordance with further determined locations of the object relative to the reference offset location.

12. The method of claim 11, wherein the subsequent controlling comprises:
    evaluating the measured signals to determine, for each of a group of time periods, a corresponding location of the object with respect to the sensing assembly; and controlling sequential locations of the indicator on the display screen in accordance with the corresponding determined locations.

13. The method of claim 11, wherein the evaluating further comprises:

evaluating the measured signals to determine a reference orientation of the object with respect to the sensing assembly.

14. The method of claim 13, wherein the subsequently controlling further comprises:

controlling orientations of the indicator on the display screen in accordance with subsequent orientations of the object relative to the reference orientation.

15. The method of claim 11, wherein the first specified pattern of movement includes a slide gesture followed by a hover gesture.

16. The method of claim 15, wherein the reference offset location is a location corresponding to the object during the hover gesture.

17. The method of claim 11, wherein the subsequently controlling comprises:

detecting movement of the object in a second pattern of movement in an offset volume, wherein the second pattern of movement includes at least one of a push/pull gesture, a slide gesture, and a tilt gesture.

18. The method of claim 17 wherein the offset volume does not include a first three-dimensional volume defined by an area within the display screen and extending in a normal vector away from the display screen.

19. The method of claim 11 further comprising:

detecting a third pattern of movement; and controlling the electronic device based upon the third pattern of movement.

* * * * *